(12) United States Patent
Ichijo et al.

(10) Patent No.: US 8,334,568 B2
(45) Date of Patent: Dec. 18, 2012

(54) SEMICONDUCTOR DEVICE AND METHOD FOR PRODUCING THE SAME

(75) Inventors: Hisao Ichijo, Osaka (JP); Alberto Adan, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 168 days.

(21) Appl. No.: 12/939,273

(22) Filed: Nov. 4, 2010

(65) Prior Publication Data

US 2011/0101454 A1    May 5, 2011

(30) Foreign Application Priority Data

Nov. 5, 2009   (JP) ................................. 2009-254439

(51) Int. Cl.
   *H01L 29/76*   (2006.01)
(52) U.S. Cl. ................ 257/343; 257/409; 257/E21.417; 257/E29.261
(58) Field of Classification Search .................. 257/369, 257/E29.261, E21.417, 343, 339, 335, 409
   See application file for complete search history.

(56) References Cited

U.S. PATENT DOCUMENTS

| | | | | |
|---|---|---|---|---|
| 5,796,146 A * | 8/1998 | Ludikhuize | .................... | 257/343 |
| 6,888,210 B2 * | 5/2005 | Jeon et al. | .................... | 257/492 |
| 2002/0060341 A1 * | 5/2002 | Terashima | .................... | 257/335 |
| 2009/0020814 A1 * | 1/2009 | Choi et al. | .................... | 257/343 |
| 2009/0159970 A1 * | 6/2009 | Ichijo et al. | .................... | 257/343 |

FOREIGN PATENT DOCUMENTS

| | | |
|---|---|---|
| JP | 2004-22769 A | 1/2004 |
| JP | 2009-152371 A | 7/2009 |

* cited by examiner

*Primary Examiner* — Wael Fahmy
*Assistant Examiner* — Sarah Salerno
(74) *Attorney, Agent, or Firm* — Birch, Stewart, Kolasch & Birch, LLP

(57) ABSTRACT

A P type semiconductor substrate includes a P type body region, an N type drift region formed away from the P type body region in a direction parallel to a substrate surface, an N type drain region formed in a region separated by a field oxide film in the N type drift region so as to have a concentration higher than the N type drift region, an N type source region formed in the P type body region so as to have a concentration higher than the N type drift region. A P type buried diffusion region having a concentration higher than the N type drift region is formed of a plurality of parts each of which is connected to a part of the bottom surface of the P type body region and extends parallel to the substrate surface and its tip end reaches the inside of the drift region.

22 Claims, 21 Drawing Sheets

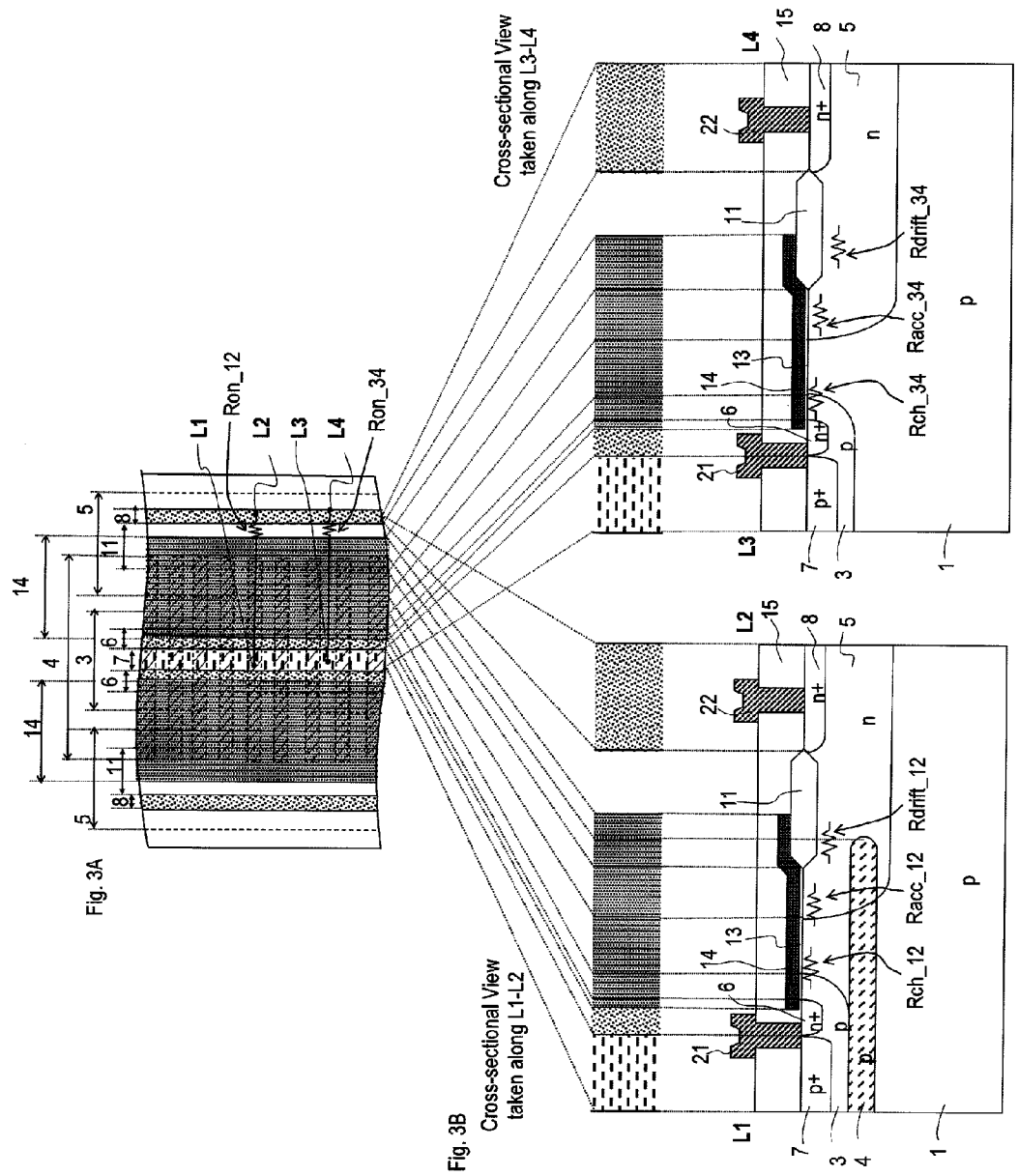

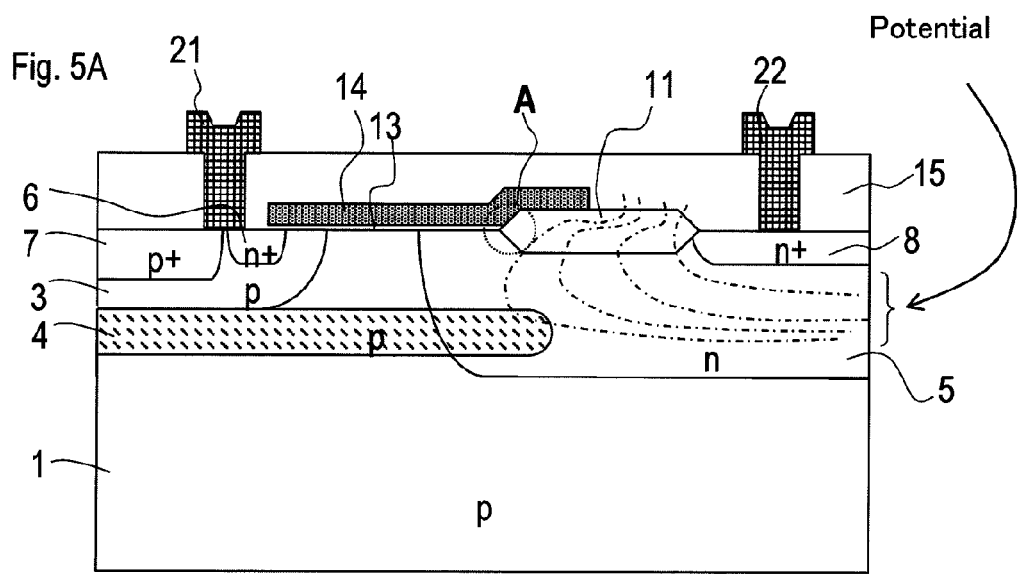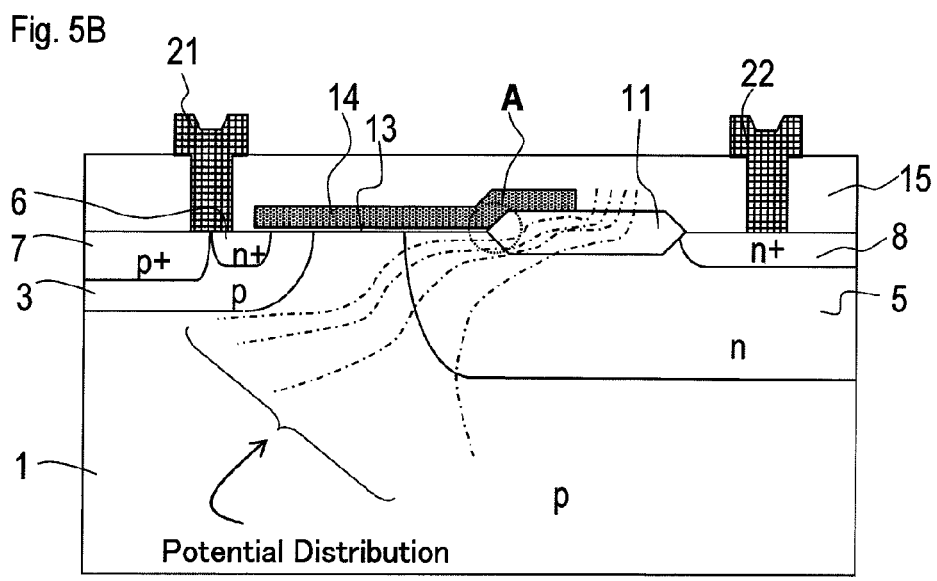

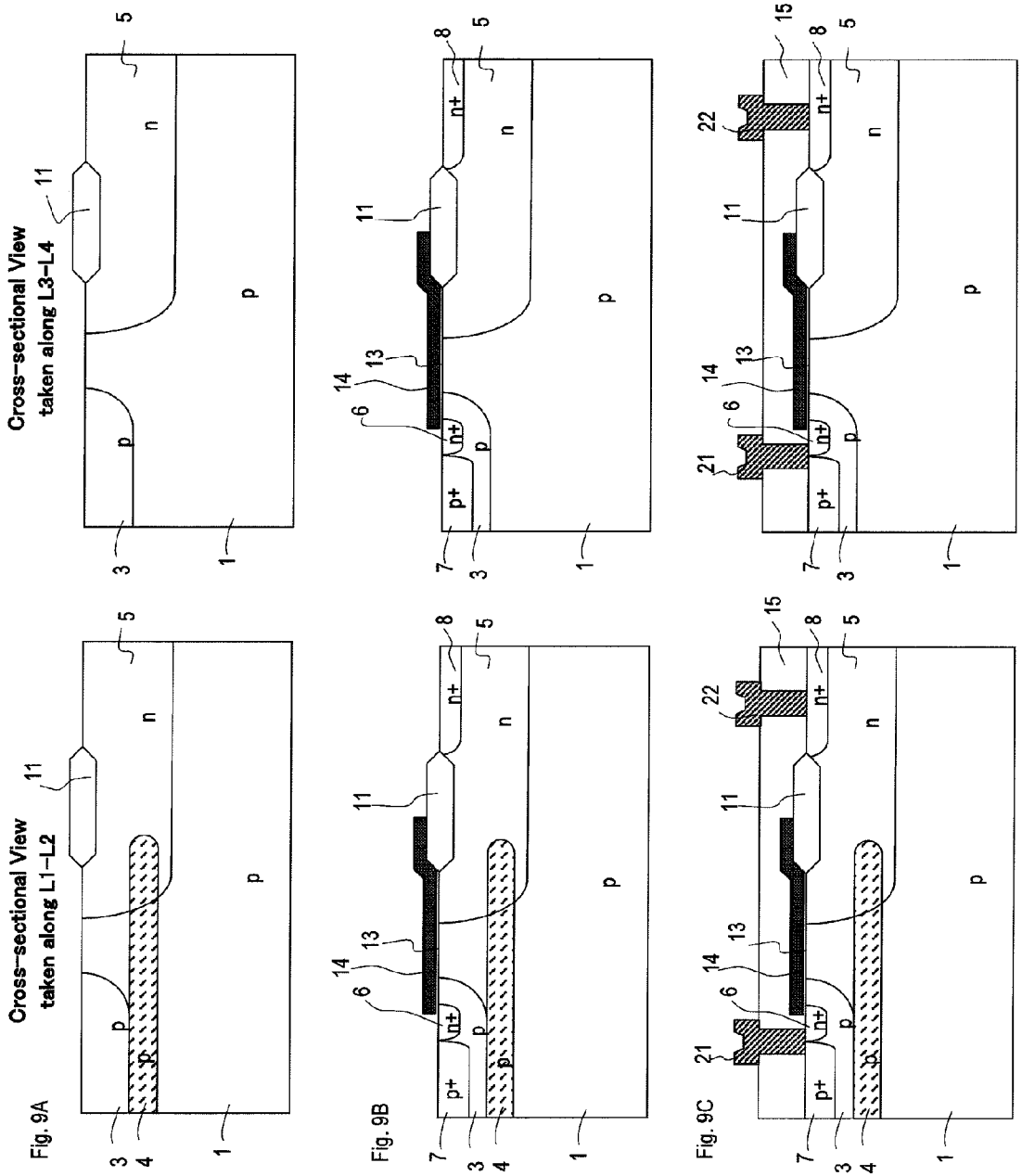

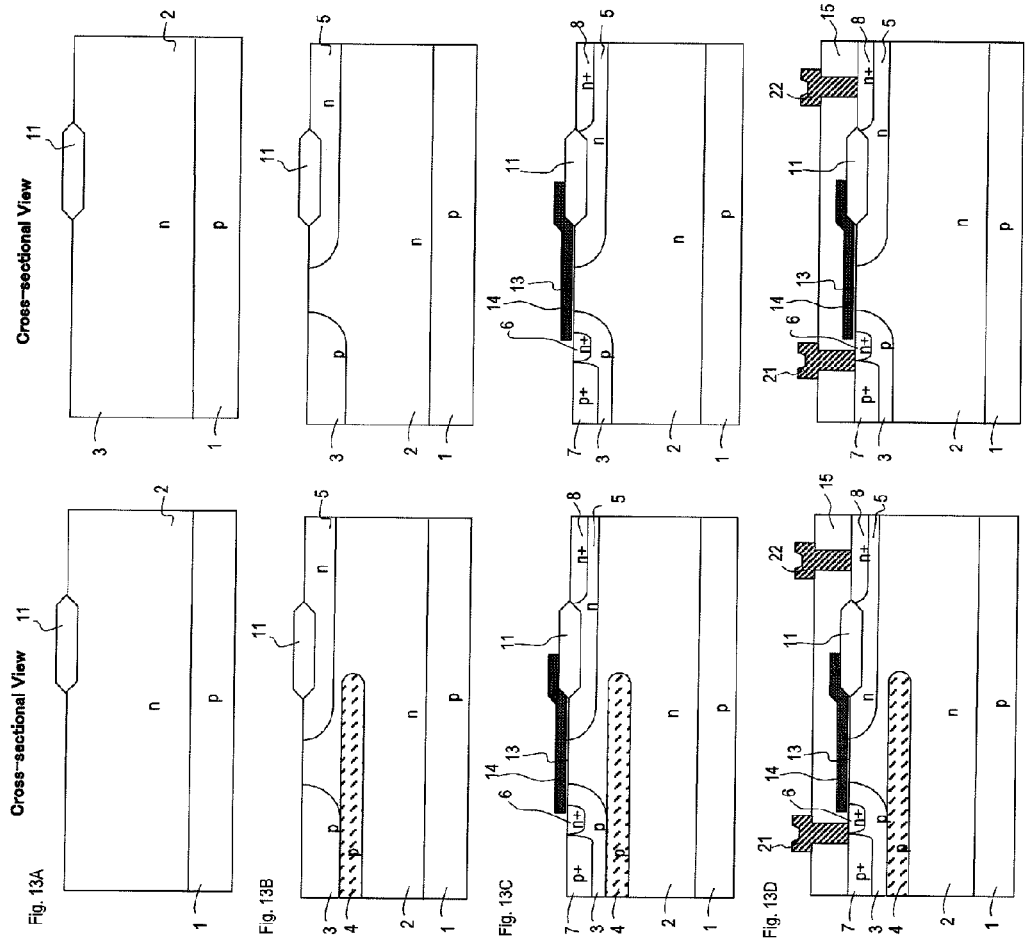

SEMICONDUCTOR DEVICE AND METHOD FOR PRODUCING THE SAME

CROSS REFERENCE TO RELATED APPLICATION

This Nonprovisional application claims priority under 35 U.S.C. §119(a) on Patent Application No. 2009-254439 filed in Japan on Nov. 5, 2009 the entire contents of which are hereby incorporated by reference.

BACKGROUND OF THE INVENTION

1. Field of the Invention

The present invention relates to a semiconductor device and a method for producing the same and more particularly, to a LDMOS transistor (lateral double diffusion MOS transistor) and a method for producing the same.

2. Description of the Related Art

The LDMOS transistor has features of being high in switching speed, and being easily used because of an voltage drive system, and it is used for a switching regulator, various kinds of drivers, a DC-DC converter, and the like, taking advantage of the features, so that it becomes a key device in a present power-high breakdown voltage field.

In general, a performance of the LDMOS transistor is represented by a breakdown voltage (yield breakdown voltage) at an off-time and an on resistance. However, they normally have a trade-off relationship, so that it is difficult to realize a high breakdown voltage and a low on resistance. Therefore, development has been made for a long time to realize both of them.

Hereinafter, a description will be made of a conventional LDMOS transistor disclosed in Japanese Unexamined Patent Publication No. 2004-22769 (hereinafter, referred to as the patent document 1). FIGS. 17A and 17B are schematic structure diagrams showing an N channel LDMOS transistor formed on a P type semiconductor substrate, in which FIG. 17A is a top schematic view and FIG. 17B is a cross-sectional schematic view. In addition, FIG. 17B shows a cross-section taken along a line L1-L2 in FIG. 17A. In addition, an interlayer insulation film 15, a source electrode 21, and a drain electrode 22 are not shown in the top schematic view in FIG. 17A, among components shown in FIG. 17B.

As shown in FIGS. 17A and 17B, the conventional N channel LDMOS transistor is provided in such a manner that a P type embedded diffusion region 91 is formed with high energy implantation so as to be continued to a bottom surface of a P type body region 3 formed on a surface of a P type semiconductor substrate 1. A low-concentration N type drift region 5 is formed on the surface of the P type semiconductor substrate 1 so as to be away from the P type body region 3, and the P type embedded diffusion region 91 is formed so that its tip end reaches an inside of the N type drift region 5. FIG. 17A shows a formation region of the P type embedded diffusion region 91 by falling diagonal strokes from to top left to bottom right.

A high-concentration N type source region 6 and a high-concentration P type body contact region 7 are formed on the surface side in the P type body region 3. A high-concentration N type drain region 8 is formed on the part of surface side in the N type drift region 5. In addition, in FIGS. 17A and 17B, the drain region 8 is formed in the drift region 5 on the side opposite to the source region 6 across a field oxide film 11 formed on the drift region 5.

A gate electrode 14 is formed on a gate oxide film 13 formed on the semiconductor substrate 1, and this gate electrode 14 is formed so as to be overlapped commonly on a part of the P type body region 3 and a part of the N type drift region 5. A part of the gate electrode 14 is formed so as to be stranded on the field oxide film 11. Thus, the interlayer insulation film 15 is formed so as to cover the whole surface of the semiconductor substrate 1 including the gate electrode 14.

Thus, the source electrode 21 is formed so as to penetrate the interlayer insulation film 15 and to be in contact with the N type source region 6 and the P type body contact region 7. Similarly, the drain electrode 22 is formed so as to penetrate the interlayer insulation film 15 and to be in contact with the N type drain region 8. The N type source region 6 and the P type body region 3 are electrically at the same potential due to the source electrode 21.

When a breakdown voltage at the time of power-off is measured in the N channel LDMOS transistor, the source electrode 21 and the gate electrode 14 are set to the GND potential, and a plus potential is applied to the drain electrode 22. Thus, when a reverse bias voltage is applied between the drain and the source, an electric field in a depletion layer reaches a critical electric field at a certain voltage, and avalanche breakdown is generated, so that a current starts rapidly flowing between the drain and source. The applied voltage at this time is the breakdown voltage value of the transistor.

In general, when the reverse bias is applied between the drain and the source in the LDMOS transistor, the electric field concentrates around a gate edge (shown by a region A in FIG. 17B) which is provided at an end part of the gate electrode formed on the gate oxide film, on the side of the drain region, which causes the breakdown voltage to be lowered. Therefore, in order to increase the breakdown voltage, it is important to relax the electric field around the gate edge. In addition, when the electric field concentrates around the gate edge, a certain amount of electric charges are left in the gate oxide film 13, which could cause reliability to be lowered. As a result, to relax the electric field around the gate edge is important to improve the reliability of the LDMOS transistor.

Thus, in order to relax the electric field around the gate edge, as described above, the P type embedded diffusion region 91 is provided so as to be continued to the whole bottom surface of the P type body region 3 and the P type embedded diffusion region 91 is formed by high-energy implantation so as to be embedded in the N type drift region 5 in the conventional LDMOS transistor disclosed in the patent document 1. At this time, the P type embedded diffusion region 91 is formed so as to have a concentration higher than that of N type drift region 5.

When the reverse bias is applied between the drain and source in the structure shown in FIGS. 17A and 17B, a depletion layer extends from a joint interface between the P type embedded diffusion region 91 and the N type drift region 5, as described above, but since the concentration of the P type embedded diffusion region 91 is higher than that of the N type drift region 5, the depletion layer easily extends toward the N type drift region 5, so that the whole area of the N type drift region 5 is substantially depleted. As a result, the electric field around the surface including the gate edge (region A) can be sufficiently relaxed. Thus, in a case where the same breakdown voltage is ensured, since the concentration of the N type drift region 5 can be set to be higher, the trade-off relationship between the breakdown voltage and the on resistance of the device can be considerably improved.

SUMMARY OF THE INVENTION

In designing the LDMOS transistor, the concentration and a drift length (Ldrift in FIG. 17B) of the N type drift region 5 are to be appropriately set so as to ensure the off-breakdown voltage and minimize the on resistance, based on a condition of use on a circuit, in general.

Thus, when a higher breakdown voltage is required, depending on the condition of use on the circuit, each parameter is usually adjusted to satisfy desired characteristics in such a manner that the concentration of the N type drift region 5 is decreased, or the drift length Ldrift is increased, without changing the basic structure of the device.

However, when a higher breakdown voltage is realized in the LDMOS transistor disclosed in the patent document 1, the following problem is generated.

In order to realize the higher breakdown voltage while keeping the on resistance low, it is necessary to set the drift length Ldrift to be as small as possible while keeping the concentration of the N type drift region 5 low. However, as the drift length Ldrift decreases, the breakdown voltage at the time of gate-on (hereinafter, referred to as the "on-breakdown voltage") decreases. That is, as shown in FIG. 18, the off-breakdown voltage and the on-breakdown voltage have the trade-off relationship with respect to the concentration of the N type drift region 5. That is, in order to increase the off-breakdown voltage, it is necessary to decrease the N type drift concentration, but this lowers the on-breakdown voltage on the other hand. This is caused by the fact that an electric field concentration part at the time of breakdown due to the off-breakdown voltage is different from that at the breakdown due to the on-breakdown voltage, which will be described in detail below, with reference to the drawings.

First, the on-breakdown voltage will be described with reference to FIGS. 17A, 17B, and 19. FIG. 19 shows a relationship between a drain current and a drain voltage when the drain voltage increases at the time of gate-on. When the drain voltage increases to a certain level at the time of gate-on, the electric field concentrates at a certain part and when the electric field exceeds a critical electric field, avalanche breakdown is caused, and the drain current starts increasing (s1 in FIG. 19). This drain current flows through the P type body region 3 and is collected by the source electrode 21.

Thus, when the drain voltage further increases, the product of the resistance in the P type body region 3 and the drain current (avalanche current) exceeds 0.6 V, a parasitic NPN transistor composed of the N type drift region 5, the P type body region 3, and the N type source region 6 is turned on. Due to this action, a current path is formed so that the drain voltage flows to a ground line connected to the N type source region 6 through the parasitic NPN transistor, and as a result, the drain current rapidly increases (s2 in FIG. 19). When the drain current rapidly increases, high Joule heat is generated in the LDMOS transistor, so that the device could be broken. The maximum value of the applied drain voltage within a range before causing the device breakdown is the on-breakdown voltage. That is, in order to increase the breakdown voltage of the LDMOS transistor, it is necessary to improve the on-breakdown voltage as well as the off-breakdown voltage.

As shown in FIGS. 17A and 17B, the electric field concentration part at the time of breakdown due to the on-breakdown voltage is not provided at the gate edge (region A in the drawing) which is the electric field concentration part at the time of breakdown due to the off-breakdown voltage but provided at an edge of the N type drain region 8 on the side of the source region (region B in the drawing). This is because the drain current flows at the time of gate-on, so that a potential distribution is shifted to the side of the drain region 8 as compared with the case at the time of gage-off, and as a result, the electric field concentration is generated due to reach-through.

As described above, it is necessary to decrease the concentration of the N type drift region 5 in order to improve the off-breakdown voltage. However, when the concentration of the N type drift region 5 decreases, the on-breakdown voltage is lowered as shown in FIG. 18, therefore the high breakdown voltage cannot be sufficiently realized. This is because when the concentration of the N type drift region 5 decreases, the potential distribution at the time of gate-on is shifted to the side of the drain region 8, and the electric field concentration is further promoted due to reach-through. In order to relax the electric field concentration, it is necessary to increase the concentration of the N type drift region 5, but in this case, the off-breakdown voltage decreases as shown in FIG. 18.

In addition, as another means for increasing the concentration of the N type drift region 5, an additional N type drift region 25 having a concentration higher than that of the N type drift region 5 but lower than that of the N type drain region 8 may be inserted as shown in FIG. 20. However, in order to form the additional N type drift region 25 without lowering the off-breakdown voltage, it is necessary to adjust the drift length in general, which complicates the production process. Furthermore, since a masking step has to be added, the problem is that the production cost is increased.

In addition, as another means for relaxing the electric field concentration at the time of on-breakdown voltage due to the reach-through, the drift length Ldrift in FIG. 17B may be increased, but when this method is used, the on resistance increases.

The present invention was made to solve the above problems, and it is an object of the present invention to provide a semiconductor device capable of realizing a high breakdown voltage, without increasing the on resistance in a LDMOS transistor, and a method for producing the same by improving mutual trade-off relationships among the off-breakdown voltage, the on-breakdown voltage, and the on resistance.

In order to achieve the above object, a semiconductor device according to the present invention includes:
a semiconductor substrate having a first conductivity type;
a body region having the first conductivity type, formed in the semiconductor substrate;
a drift region having a second conductivity type, formed away from the body region in a direction parallel to a surface of the semiconductor substrate, in the semiconductor substrate;
a drain region having the second conductivity type, formed in the drift region so as to have a concentration higher than that of the drift region;
a source region having the second conductivity type, formed in the body region so as to have a concentration higher than that of the drift region;
a buried diffusion region having the first conductivity type, formed so as to be connected to a bottom surface of the body region, and to have a plurality of projections extending from the body region in a first direction in which the drift region and the body region are separated from each other such that each tip end of the projections reaches an inside of the drift region;
a gate oxide film formed so as to be commonly overlapped on a part of the body region and a part of the drift region; and
a gate electrode formed on the gate oxide film.

In this configuration, when a gate is turned on in the semiconductor device and a drain voltage increases, electric field concentration is generated in the vicinity of an edge of the drain region on the side of the source region, in a position outside the embedded diffusion region. Here, the embedded diffusion region provided in the semiconductor device according to the present invention has the plurality of projections projecting from the body region to the drift region, that is, it is discretely formed in the drift region and between the body region and the drift region. Thus, since the electric field concentration part can be discretely formed, the drain current is separated and flows in the current path passing through the electric field concentration part and a current path not passing through the electric field concentration part. Meanwhile, in the case of the conventional configuration in which the embedded diffusion region is wholly formed such that it is connected to the whole bottom surface of the body region, and its tip end reaches the inside of the drift region, the drain current all flows through the current path passing through the electric field concentration part. Therefore, according to the semiconductor device in the present invention, the drain current (avalanche current) can be reduced, and the on-breakdown voltage can be improved as compared with the conventional configuration.

Thus, since the embedded diffusion region is connected to the bottom surface of the body region, and its tip end reaches the inside of the drift region, the low on resistance and high off-breakdown voltage can be ensured similar to the conventional configuration in which the embedded diffusion region is wholly formed so that it is connected to the whole bottom surface of the body region and its tip end reaches the inside of the drift region.

That is, according to the semiconductor device in the present invention, the on-breakdown voltage can be further improved while keeping the on resistance low and the off-breakdown voltage high, so that the trade-off relationship among them can be improved.

In addition, in the above configuration, a well having the second conductivity type may be provided in the semiconductor substrate, and each of the body region, the drift region, and the buried diffusion region may be formed in the well.

In addition, a semiconductor device includes:

a semiconductor substrate having a first conductivity type;

a well region having a second conductivity type, formed in the semiconductor substrate;

a body region having the first conductivity type, formed in the well region;

a drift region having the second conductivity type, formed away from the body region in a direction parallel to a surface of the semiconductor substrate, in the well region;

a drain region having the second conductivity type, formed in the drift region so as to have a concentration higher than that of the drift region;

a source region having the second conductivity type, formed in the body region so as to have a concentration higher than that of the drift region;

a buried diffusion region having the first conductivity type, formed so as to be connected to a bottom surface of the body region, and have a plurality of projections extending from the body region in a first direction in which the drift region and the body region are separated from each other such that each tip end of the projections reaches a position under the drift region;

a gate oxide film formed so as to be commonly overlapped on a part of the body region and a part of the drift region; and a gate electrode formed on the gate oxide film.

In this configuration also, since the buried diffusion region is discretely formed in the drift region and between the body region and the drift region, the electric field concentration part is also discretely formed, so that the on-breakdown voltage can be improved, similar to the above configuration.

Furthermore, in this configuration, since the well region having the second conductivity type is provided, the second conductivity type well region is positioned between the first conductivity type semiconductor substrate and the first conductivity type body region, the source region is electrically separated from the semiconductor substrate, and as a result, the device can be used even when the high breakdown voltage is required in the source electrode with respect to the semiconductor substrate.

In addition, in the above configuration, the drift region is formed shallowly as compared with the embedded diffusion region. Thus, effect of the impurity concentration of the drift region on the effective concentration of the embedded diffusion region can be small, so that a design required for providing desired electric characteristics can be simplified. Furthermore, even when a variation is generated in concentration of the drift region during the production process, the semiconductor device can show stable electric characteristics.

In addition, in the above configuration, the embedded diffusion region preferably has a concentration higher than that of the drift region.

In the above configuration, the well region preferably has a concentration lower than that of the drift region.

In this configuration, while the concentration of the drift region is set to be higher to reduce the on resistance, the concentration of the well is set to be lower than that of the drift region to prevent the off-breakdown voltage from being lowered.

Furthermore, in the above configuration, the buried diffusion region may be formed into a comb-shape so as to be connected to the whole bottom surface of the body region, and have the plurality of projections extending from the body region in the first direction, or the buried diffusion region may be formed into a strip-shape composed of a plurality of parts each of which is connected to a part of the bottom surface of the body region and extends in the first direction to form each of the plurality of projections.

In each configuration, since the embedded diffusion region is discretely formed in the drift region and between the body region and the drift region, the on-breakdown voltage can be improved.

In addition, in the above configuration, it is preferable that the plurality of projections of the buried diffusion region are formed so as to have a slit width at regular intervals in a second direction parallel to the surface of the semiconductor substrate and perpendicular to the first direction, and the slit width is set to be equal to or less than ½ time a distance in the first direction between the gate electrode formed on the gate oxide film and the drain region.

In this condition, almost the same off-breakdown voltage can be realized as in the conventional configuration in which the embedded diffusion region is wholly formed so that it is connected to the whole bottom surface of the body region, and its tip end reaches the inside of the drift region.

In addition, in the above configuration, the slit width is preferably set to be equal to or less than a width of the plurality of projections of the buried diffusion region in the second direction. In this condition, the high off-breakdown voltage can be realized while keeping the on resistance sufficiently low.

In addition, in the above configuration, the drift region is preferably formed so as to have concentration gradient such that an impurity concentration becomes higher from a position under a gate edge serving as an end of the gate electrode formed on the gate oxide film on the side of the drain region, toward the drain region.

Thus, the concentration of the drift region can be low in the vicinity of the gate edge in which the electric field is most likely to concentrate, and the electric field relaxation can be promoted at the time of gate-off. Furthermore, since the concentration is high in the vicinity of the drain region in which the electric field is most likely to concentrate at the time of gate-on, the electric field concentration due to the reach-through can be avoided. Thus, the trade-off relationship between the off-breakdown voltage and the on-breakdown voltage can be further improved.

In addition, in the above configuration, the buried diffusion region is preferably formed so as to broaden in a second direction parallel to the surface of the semiconductor substrate and perpendicular to the first direction, from the bottom surface of the body region to the drain region.

In addition, in the above configuration, the buried diffusion region is preferably formed at a depth of 1.5 μm or more from the surface of the semiconductor substrate.

In this configuration, the on resistance can be further reduced.

In addition, a method for producing a semiconductor device according to the present invention includes:

a step of forming a body region by implanting impurity ions having a first conductivity in a semiconductor substrate having a first conductivity type, and a step of forming a drift region by implanting impurity ions having a second conductivity type in a position on the semiconductor substrate away from the body region in a direction parallel to a surface of the semiconductor substrate, the steps of forming the body region and forming the drift region being performed in a random order;

a step of forming a buried diffusion region so as to be connected to a bottom surface of the body region, and have a plurality of projections extending from the body region in a first direction in which the drift region and the body region are separated from each other such that each tip end of the projections reaches the drift region, by implanting an impurity ion having the first conductivity type with implantation energy higher than that used when the body region is formed, using a mask pattern provided with a plurality of slits arranged in a direction parallel to the surface of the semiconductor substrate and perpendicular to the first direction;

a step of forming a source region and a drain region in the body region and the drift region, respectively by implanting impurity ions having the second conductivity type and having a concentration higher than that of the drift region, in the body region and the drift region; and a step of forming a gate oxide film so as to be commonly overlapped at least on a part of the body region and a part of the drift region, by oxidizing the surface of the semiconductor substrate and a step of forming a gate electrode on the gate oxide film.

In addition, the above production method may include a step of forming a well region having a concentration lower than that of the drift region by implanting impurity ions having the second conductivity type in the semiconductor substrate before the body region and the drift region are formed, and the body region and the drift region may be formed in the well region.

In addition, a method for producing a semiconductor device according to the present invention includes:

a step of forming a well region by implanting impurity ions having a second conductivity type in a semiconductor substrate having a first conductivity type;

a step of forming a body region by implanting impurity ions having the first conductivity type in the well region, and a step of forming a drift region by implanting impurity ions having the second conductivity type in a position of the well region away from the body region in a direction parallel to a surface of the semiconductor substrate, the steps of forming the body region and forming the drift region being performed in a random order;

a step of forming a buried diffusion region so as to be connected to a bottom surface of the body region, and have a plurality of projections extending from the body region in a first direction in which the drift region and the body region are separated from each other such that each tip end of the projections reaches a position under the drift region, by implanting an impurity ion having the first conductivity type with implantation energy higher than that used when the body region is formed, using a mask pattern provided with a plurality of slits arranged in a direction parallel to the surface of the semiconductor substrate and perpendicular to the first direction;

a step of forming a source region and a drain region in the body region and the drift region, respectively by implanting impurity ions having the second conductivity type and having a concentration higher than that of the drift region, in the body region and the drift region; and a step of forming a gate oxide film so as to be commonly overlapped at least on a part of the body region and a part of the drift region, by oxidizing the surface of the semiconductor substrate and a step of forming a gate electrode on the gate oxide film.

According to the above production methods, the mutual relationship among the off-breakdown voltage, the on-breakdown voltage, and the on resistance can be improved, so that the semiconductor device can realize the low on resistance, the high off-breakdown voltage, and the high on-breakdown voltage.

According to the semiconductor device in the present invention, the mutual trade-off relationships among the off-breakdown voltage, the on-breakdown voltage, and the on resistance are improved, so that high breakdown voltage can be realized without increasing the on resistance. In addition, according to the method for producing the semiconductor device, the semiconductor device having the low on resistance, and the high breakdown voltage can be produced without performing a complicated step.

BRIEF DESCRIPTION OF THE DRAWINGS

FIGS. 3A and 3B are schematic structure diagrams of the N channel LDMOS transistor according to the present invention to which resistance components are schematically added.

FIGS. 5A and 5B are views to explain a relationship between presence/absence of the embedded diffusion region and a potential distribution;

FIGS. 9A to 9C are cross-sectional views showing a method for producing an N channel LDMOS transistor according to a first embodiment;

FIGS. 13A to 13D are cross-sectional views showing a method for producing the N channel LDMOS transistor according to the second embodiment;

FIG. 19 is a view showing a relationship between a drain voltage and a drain current at the time of gate-on;

DETAILED DESCRIPTION OF THE INVENTION

First Embodiment

A description will be made of a first embodiment of a semiconductor device according to the present invention with reference to FIGS. 1A to 9C. In addition, the same component as that in FIG. 17 has the same reference in the following drawings and its description is omitted.

Figure 1A:
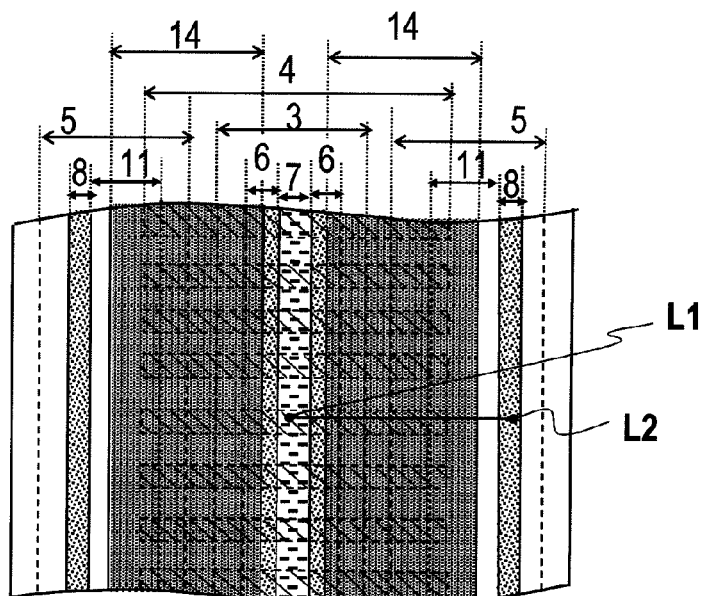
FIGS. 1A and 1B are schematic structure diagrams of an N channel LDMOS transistor according to the present invention.
Figure 1B:
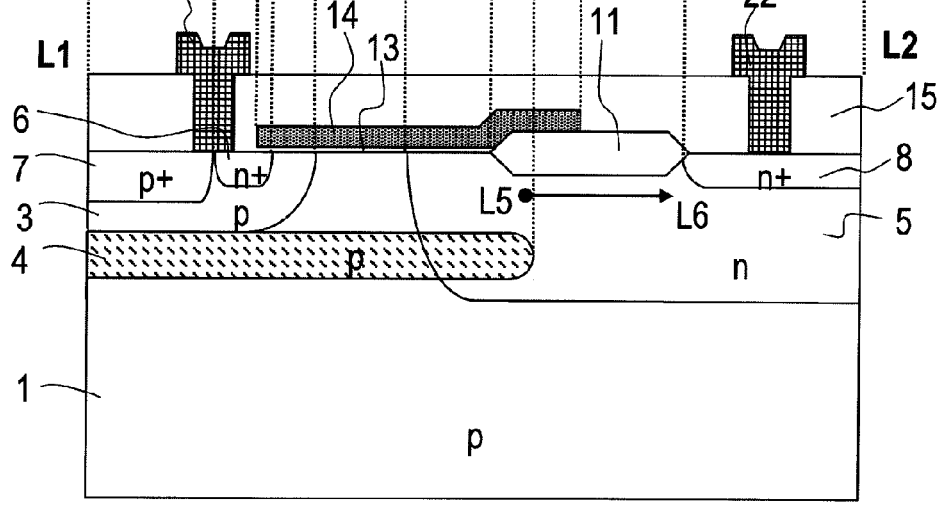
Figure 2A:
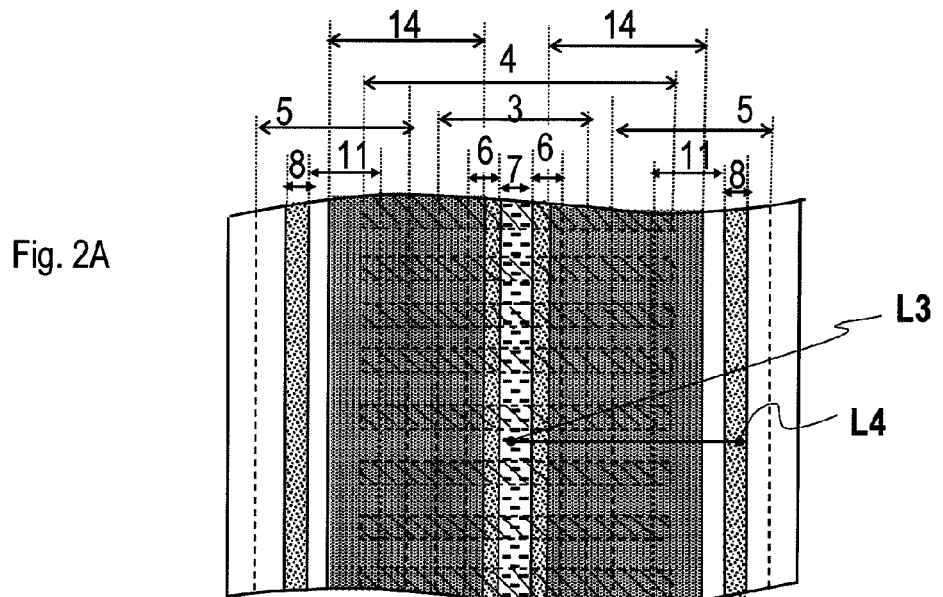
FIGS. 2A and 2B are schematic structure diagrams of the N channel LDMOS transistor according to the present invention.
Figure 2B:
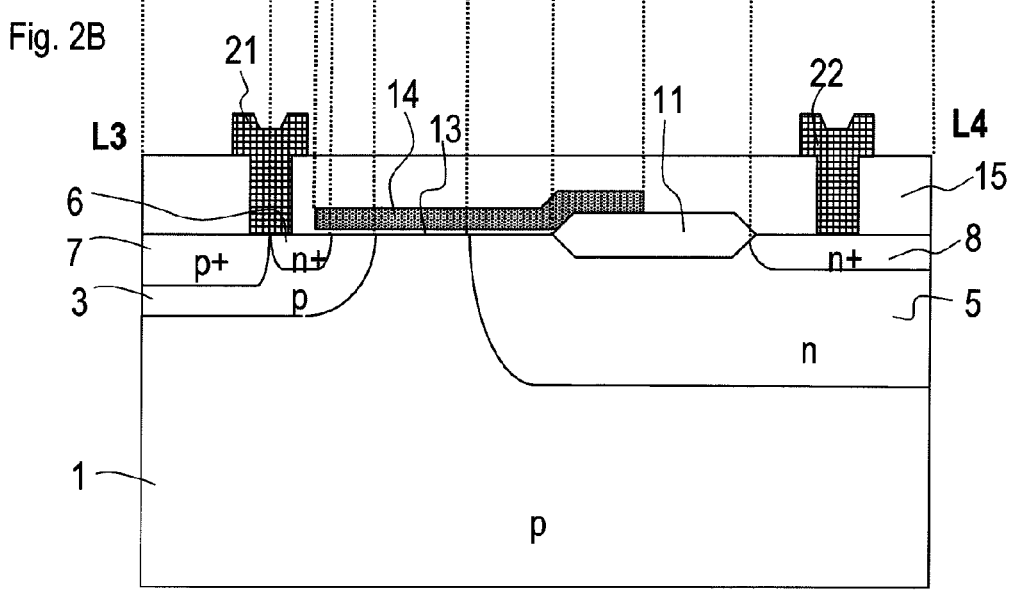

FIGS. 1A to 2B are schematic structure diagrams of an N channel LDMOS transistor serving as the semiconductor device in this embodiment. FIG. 1A and FIG. 2A are top schematic views, and both are totally the same. Meanwhile, FIG. 1B and FIG. 2B are both cross-sectional schematic views, but they are different in cut position such that FIG. 1B shows a cross-section cut along a line L1-L2, and FIG. 2B shows a cross-section cut along a line L3-L4.

In addition, these drawings are just shown schematically, so that an actual dimension ratio does not always coincide with a dimension ratio in the drawing. This is applied to the following drawings.

The N channel LDMOS transistor in this embodiment has a structure different from the structure shown in FIG. 17 in that a P type embedded diffusion region 4 has a buried shape different from that of the P type embedded diffusion region 91. In addition, in FIGS. 1A and 2A, the P type embedded diffusion region 4 is indicated in a region shown by falling diagonal strokes from top left to bottom right.

The P type embedded diffusion region 91 shown in FIG. 17 is formed such that it is continued to the whole bottom surface of the P type body region 3, and its tip end reaches the inside of the N type drift region 5. That is, the P type embedded diffusion region 91 is formed in the region from the position of its tip end in the N type drift region 5 to the bottom surface of the P type body region 3.

Meanwhile, the P type embedded diffusion region 4 shown in FIGS. 1A to 2B is not provided so as to be continued to the whole bottom surface of the P type body region 3. More specifically, while it is provided so as to be continued to a part of the bottom surface of the P type body region 3, it is not provided on the other part of the bottom surface thereof. That is, the P type embedded diffusion region 4 is composed of a plurality of parts discretely connected to the part of the bottom surface of the P type body region 3. Thus, each part of them extends from the P type body region 3 to the N type drift region 5, and its tip end reaches the inside of the N type drift region 5. That is, the P type embedded diffusion region 4 has a strip-shape extending from the P type body region 3 to the N type drift region 5. FIGS. 1A to 2B show a case where the P type embedded diffusion regions 4 are formed in a planar direction at regular intervals. Thus, the line L1-L2 shown in FIG. 1A corresponds to the position in which the P type embedded diffusion region 4 is formed on the bottom surface of the P type body region 3, and the line L3-L4 shown in FIG. 2A corresponds to the position in which the P type embedded diffusion region 4 is not formed on the bottom surface of the P type body region 3.

In this structure, as compared with the conventional structure shown in FIG. 17, mutual trade-off relationships among the off-breakdown voltage, the on-breakdown voltage, and the on resistance can be improved, so that a high breakdown voltage can be realized without increasing the on resistance. A reason for this will be described below.

FIGS. 3A and 3B unify FIGS. 1A to 2B, and resistance components such as the on resistance and a channel resistance are added to each drawing. An on resistance Ron of the N channel LDMOS transistor in this embodiment is represented by a parallel connection between an on resistance Ron_12 in the position cut by the line L1-L2 in which the P type embedded diffusion region 4 is continued to the bottom surface of the P type body region 3, and an on resistance Ron_34 in the position cut by the line L3-L4 in which the P type embedded diffusion region 4 is not formed on the bottom surface of the P type body region 3, and described by the following formula 1.

$$1/Ron = 1/Ron\_12 + 1/Ron\_34 \quad (1)$$

In addition, the on resistance Ron is described by the following formula 2, wherein Rch represents a channel resistance of the electron-induced MOSFET, Racc represents a resistance in a region in which electrons are accumulated in a gate/drain overlapped region, and Rdrift represents a resistance in the thinly doped drift region 5.

$$Ron = Rch + Racc + Rdrift \quad (2)$$

That is, as shown in FIG. 3, the on resistance Ron_12 in the line L1-L2 and the on resistance Ron_34 in the line L3-L4 can be represented by the following formulas 3 and 4, respectively, wherein Rch_12, Racc_12, and Rdrift_12 represent Rch, Racc, and Rdrift in the line L1-L2, respectively, and Rch_34, Racc_34, and Rdrift_34 represent Rch, Racc, and Rdrift in the line L3-L4, respectively.

$$Ron\_12 = Rch\_12 + Racc\_12 + Rdrift\_12 \quad (3)$$

$$Ron\_34 = Rch\_34 + Racc\_34 + Rdrift\_34 \quad (4)$$

Here, since the cross-sectional structure along the line L1-L2 and the cross-sectional structure along the line L3-L4 are the same except for the presence or absence of the P type embedded diffusion region 4, Rch and Racc are equal to each other, satisfying the relationships of Rch_12=Rch_34, and Racc_12=Racc_34.

Meanwhile, as for the resistance Rdrift in the N type drift region 5, since the electron path is narrowed due to the presence of the P type embedded diffusion region 4 in the cross-sectional structure along the line L1-L2, the resistance Rdrift is higher than that of the cross-sectional structure along the line L3-L4, satisfying the relationship of Rdrift_12>Rdrift_34.

Therefore, based on the formula 3 and the formula 4, it follows that Ron_12>Ron_34, and based on this result and the formula 1, the on resistance Ron of the N channel LDMOS transistor in this embodiment satisfies the relationship of the following formula 5.

$$1/Ron = 1/Ron\_12 + 1/Ron\_34 > 2/Ron\_12 \quad (5)$$

In the formula 5, "2/Ron_12" on the rightmost side corresponds to an inverse of the on resistance of the LDMOS transistor when the P type embedded diffusion region 4 is not formed on the bottom surface of the P type body region 3, and "1/Ron" on the leftmost side corresponds to an inverse of the on resistance of the LDMOS transistor in this embodiment shown in FIGS. 1A to 2B. Thus, it can be understood by the formula 5 that the N type channel LDMOS transistor in this embodiment can decrease the on resistance, similar to the conventional configuration shown in FIG. 17, as compared with the conventional LDMOS transistor which is not provided with the P type embedded diffusion region.

Figure 4A:
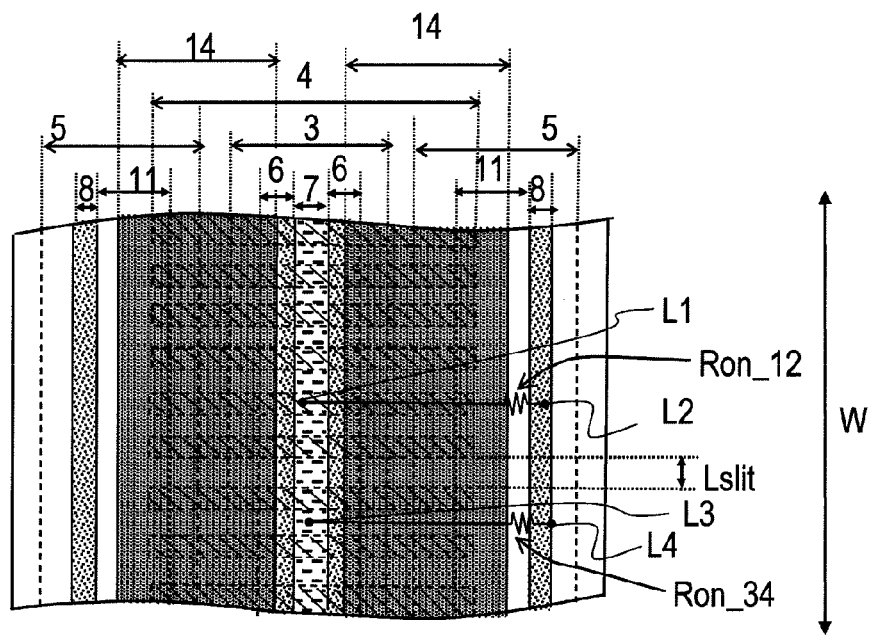
FIGS. 4A and 4B are views to explain a relationship between a formation interval of an embedded diffusion region and an off-breakdown voltage.
Figure 4B:
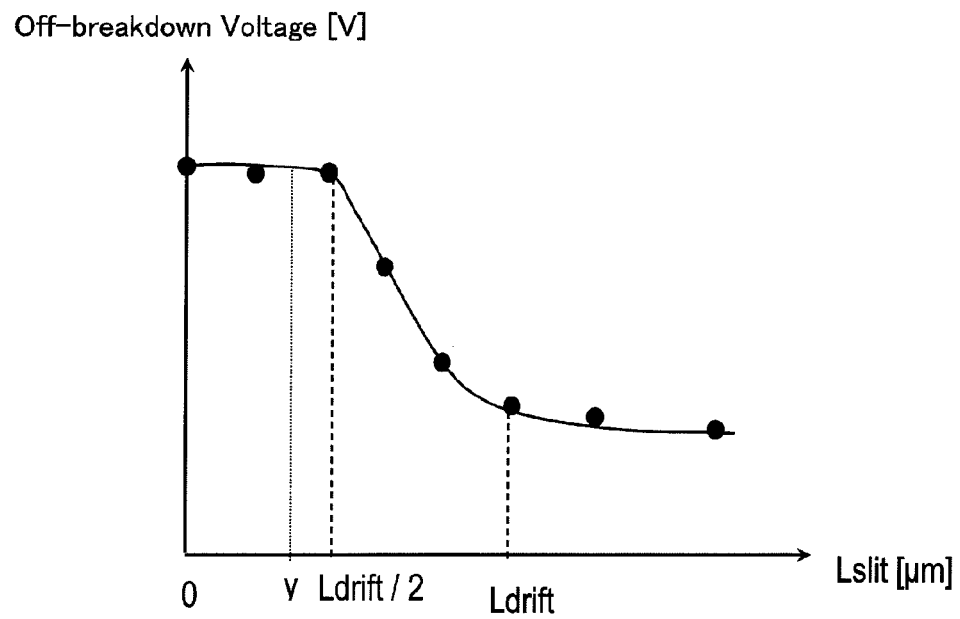

Next, the off-breakdown voltage will be described. FIGS. 4A and 4B are views to explain the off-breakdown voltage. FIG. 4A is a planar perspective view of the LDMOS transistor in this embodiment similar to FIGS. 1A to 3B, but in this drawing, a reference Lslit is allocated to an interval between the strips of the P type embedded diffusion region 4 having the strip shape, that is, formation intervals (slit intervals) perpendicular to a strip extending direction. In addition, FIG. 4B is a graph showing a relationship between a length of the formation interval Lslit and the off-breakdown voltage of the LDMOS transistor.

As shown in FIG. 4B, the off-breakdown voltage depends on the formation interval Lslit of the P type embedded diffusion region 4, and the breakdown voltage is highest when Lslit=0 μM, that is, when the P type embedded diffusion region 4 is formed without the interval (such as the structure similar to the conventional LDMOS transistor shown in FIG. 17). Meanwhile, it is lowest when Lslit=W, wherein W represents a length of the P type body region 3 extending in a vertical direction on a sheet surface of FIG. 4A, that is, when the P type embedded diffusion region 4 does not exist on the bottom surface of the whole P type body region 3.

A reason for this will be described below. That is, when the P type embedded diffusion region 4 is formed without any interval, the P type embedded diffusion region 4 is formed on the whole region in which the source region 6 and the drain region 8 (or a drift region 5) are opposed as shown in FIG. 5A, so that an electric field at a gate edge shown by a region A in the drawing is sufficiently relaxed and the off-breakdown voltages is high. Meanwhile, when the P type embedded diffusion region 4 does not exist on the bottom surface of the whole P type body region 3, the electric field at the gate edge shown by the region A in the drawing is not relaxed, therefore the off-breakdown voltages is low.

FIGS. 5A and 5B are conceptual views of potential distributions when the P type embedded diffusion region 4 exists (FIG. 5A) and when it does not exist (FIG. 5B). When the P type embedded diffusion region 4 exists, a depletion layer extends to the vicinity of the N type drain region 8, therefore the electric field does not concentrate around the region A. Meanwhile, when the P type embedded diffusion region 4 does not exist, the depletion layer hardly extends, therefore the electric field concentrates around the region A and the off-breakdown voltages is low. For example, in designing a LDMOS transistor to realize the off-breakdown voltage of 100 V or more, when the P type embedded diffusion region 4 exists, the off-breakdown voltage of about 120V is realized, but when the P type embedded diffusion region 4 does not exist, the off-breakdown voltage is only about 40 V.

Figure 6A:
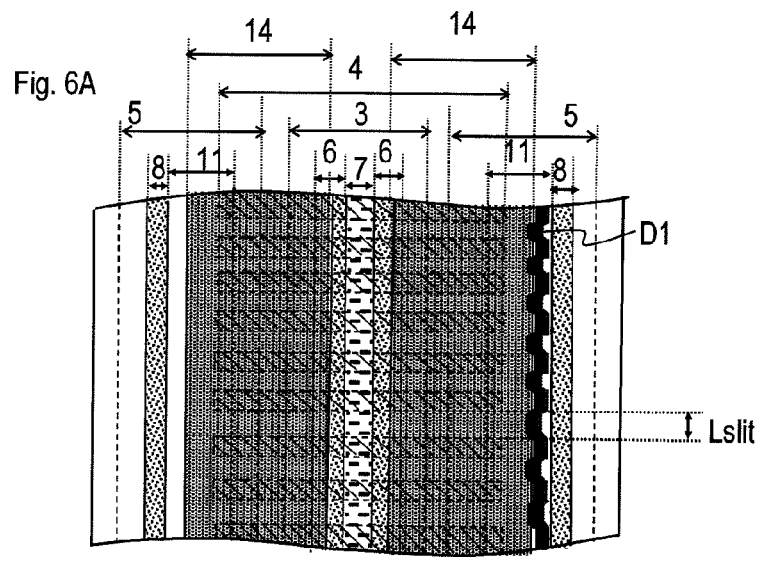
FIGS. 6A to 6C are views to explain a relationship between the presence/absence of the embedded diffusion region and extension of a depletion layer.
Figure 6B:
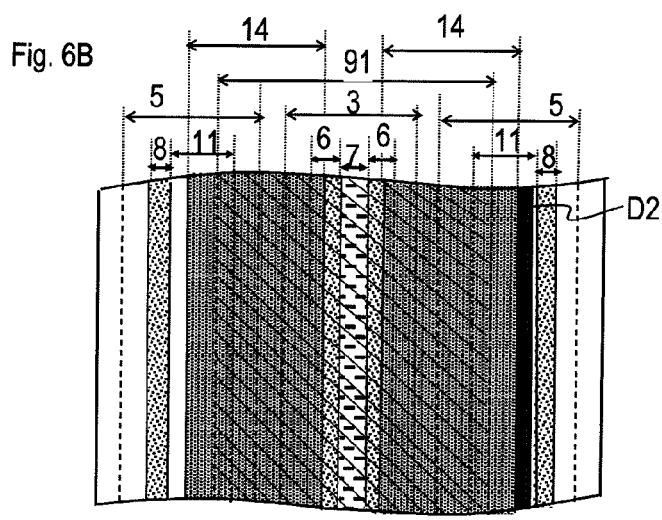
Figure 6C:
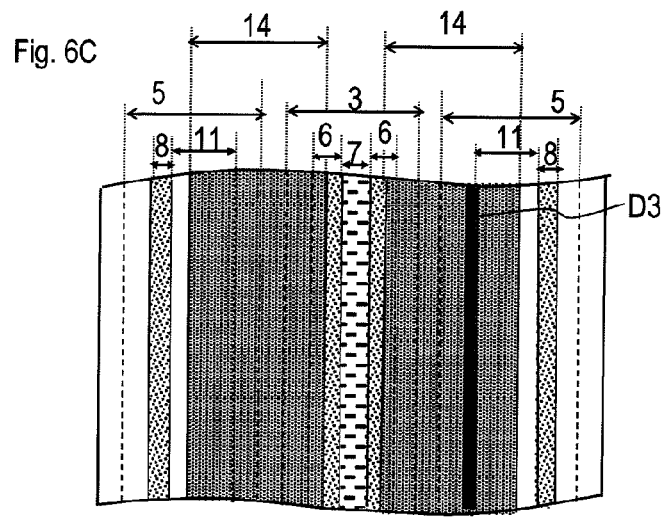

As shown in FIG. 4B, the off-breakdown voltage depends on the formation interval Lslit of the P type embedded diffusion region 4, and, when the Lslit is designed to be a drift length Ldrift or less, the off-breakdown voltage starts increasing, and when it is designed to be less than Ldrift/2, the off-breakdown voltages sufficiently improved. Therefore, the Lslit is desirably designed to be less than Ldrift/2 ("y" in FIG. 4B, for example). A state of the depletion layer at this time is shown in FIG. 6A. In addition, FIG. 6B shows a state of the depletion layer when the P type embedded diffusion region 4 is formed on the whole surface and FIG. 6C shows a state of the depletion layer when the P type embedded diffusion region 4 is not formed, for comparison.

As shown in FIG. 6A, although an extension amount of a depletion layer D1 is different between the position in which the P type embedded diffusion region 4 is formed and the position in which it is not formed, but the depletion layer can extend to the side of the drain region 8 even in the region in which the P type embedded diffusion region 4 is not formed, by setting the Lslit to an appropriate value to receive an influence from the adjacent P type embedded diffusion region 4. Although the depletion layer extends to the side of the drain region 8 less than a depletion layer D2 in the case where the P type embedded diffusion region 4 exists on the whole bottom surface of the P type body region 3 (FIG. 6B), the depletion layer can sufficiently extend to the side of the drain region 8, as compared with a depletion layer D3 in the case where the P type embedded diffusion region 4 does not exist on the bottom surface of the P type body region 3 (FIG. 6C). Therefore, the electric field can be prevented from concentrating around the gate edge (region A in FIGS. 5A and 5B), and the off-breakdown voltage can be prevented from being lowered.

At this time, as shown in FIG. 4B, when the formation Lslit of the P type embedded diffusion region 4 is set to be Ldrift/2 or less, the off-breakdown voltage can be provided to the same degree as in the case where the P type embedded diffusion region 4 is formed on the whole surface of the P type body region 3.

Next, the on-breakdown voltage will be described. As described above, in order to improve the on-breakdown voltage, it is necessary to reduce the avalanche current when the drain voltage increases at the time of gate-on, and an avalanche current $I_{body}$ is described by the following formula $$I_{body} = I_{drain} \times \frac{\alpha(T) \times \lambda}{E_{cri}} \times E_{max} \times \exp\left(-\frac{E_{cri}}{E_{max}}\right) \quad (6)$$

In the formula 6, $E_{max}$ represents a maximum electric field value when the drain voltage increases at the time of gate-on, $E_{cri}$ represents a critical electric field, $\alpha(T)$ represents a constant having a positive temperature coefficient, $I_{drain}$ represents a drain current flowing in the maximum electric field part, and $\lambda$ represents a constant which is fixed when the device structure is the same.

According to the formula 6, in order to reduce the avalanche current, it is necessary to reduce $E_{max}$, or $I_{drain}$, that is, the drain current value flowing in the maximum electric field part. The LDMOS transistor according to the present invention can reduce the avalanche current by the latter method, that is, by reducing the drain current value $I_{drain}$ flowing in the maximum electric field part.

Figure 7A:
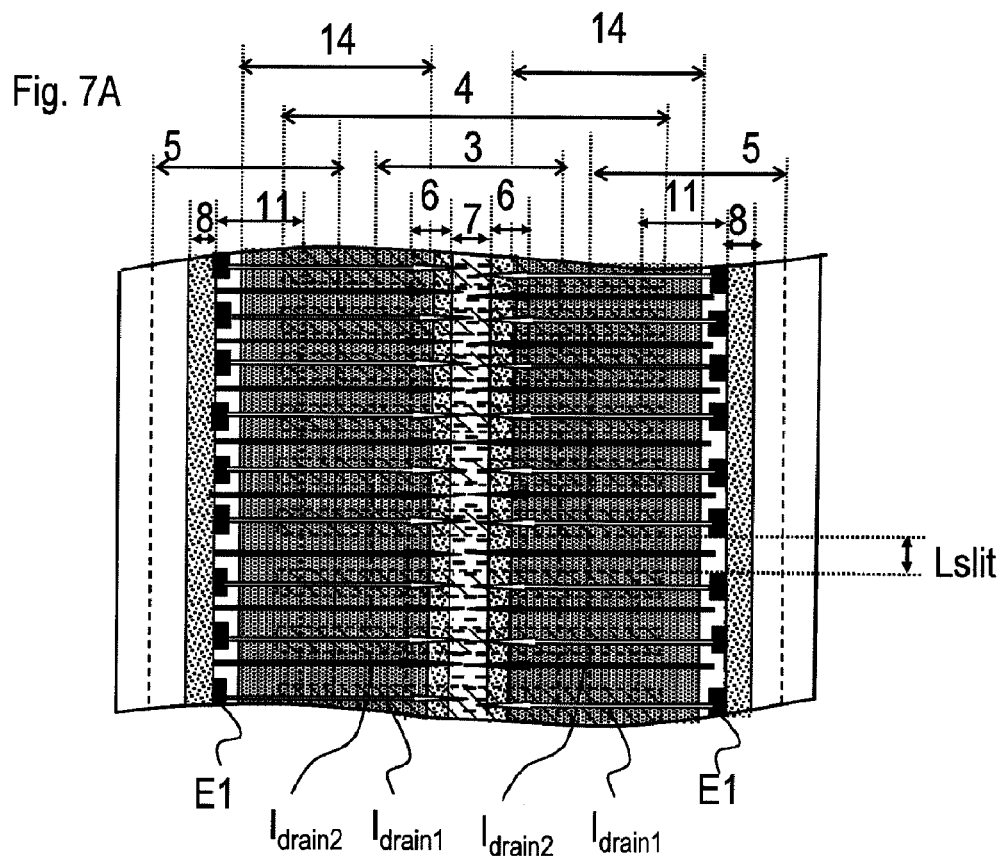
FIGS. 7A and 7B are views to explain a relationship between a format pattern of the embedded diffusion region and an electric field concentration part.
Figure 7B:
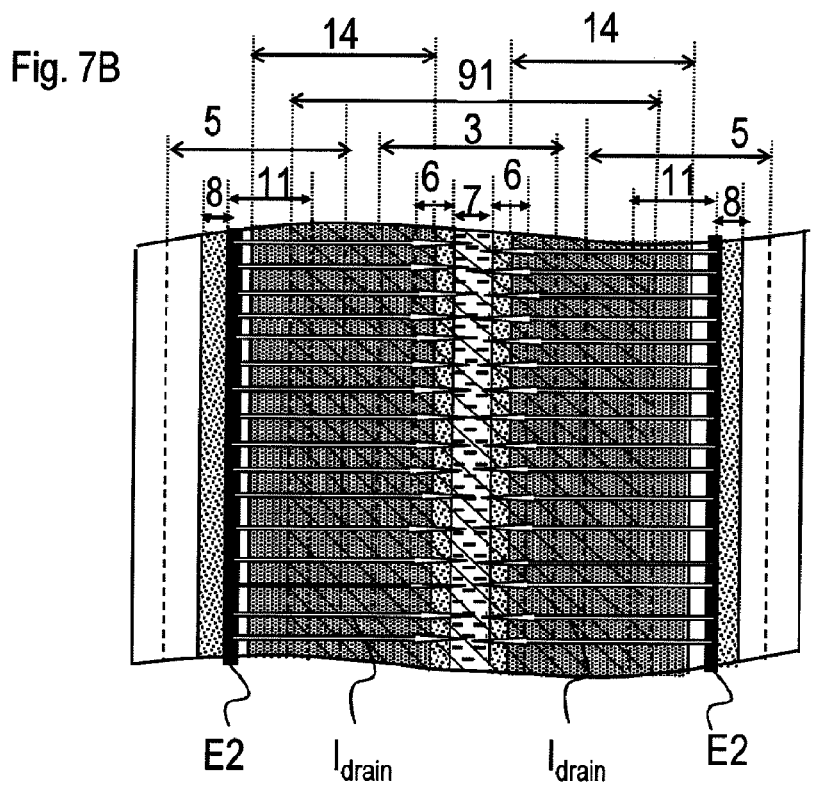

Regarding the conventional LDMOS transistor shown in FIG. 17, when the drain voltage increases at the time of gate-on, as shown in the schematic view in FIG. 7B, an electric field concentration part E2 is provided around the edge of the N type drain region 8 on the side of the source region 7, and the drain current $I_{drain}$ all flows in this maximum electric field part E2.

Meanwhile, regarding the LDMOS transistor in this embodiment, when the drain voltage increases at the time of gate-on, as shown in the schematic view in FIG. 7A, an electric field concentration part E1 is provided around the edge of the N type drain region 8 on the side of the source region 7, in a position outside the P type embedded diffusion region 4. That is, due to the formation interval of the P type embedded diffusion region 4, the electric field concentration part E1 is also formed at a predetermined intervals around the edge of the N type drain region 8 on the side of the source region 7. This is because electric field concentration occurs due to the reach-through at the time of gate-on, so that the depletion layer is shifted to the side of the drain region 8, in the position when the P type embedded diffusion region 4 is formed.

Here, in the position having the P type embedded diffusion region, an avalanche current $I_{body1}$ is described by the following formula 7, wherein $I_{drain1}$ represents a drain current and $E_{max1}$ represents a maximum electric field.

$$I_{body1} = I_{drain1} \times \frac{\alpha(T) \times \lambda}{E_{cri}} \times E_{max1} \times \exp\left(-\frac{E_{cri}}{E_{max1}}\right) \quad (7)$$

In addition, in the position having no P type embedded diffusion region 4, an avalanche current $I_{body2}$ is described by the following formula 8, wherein $I_{drain2}$ represents a drain current and $E_{max2}$ represents a maximum electric field.

$$I_{body2} = I_{drain2} \times \frac{\alpha(T) \times \lambda}{E_{cri}} \times E_{max2} \times \exp\left(-\frac{E_{cri}}{E_{max2}}\right) \quad (8)$$

Here, as shown in FIG. 7A, since the part E1 in which the electric field concentrates is provided in the position of the P type embedded diffusion region 4, it follows that $E_{max1} > E_{max2}$. Thus, based on the formula 7 and the formula 8, it follows that $I_{body1} > I_{body2}$.

Therefore, the total avalanche current $I_{body}$ satisfies the relationship shown in the following formula 9.

$$I_{body} = I_{body1} + I_{body2} < 2I_{body1} \quad (9)$$

In the formula 9, "$2I_{body1}$" on the rightmost side corresponds to the avalanche current of the conventional LDMOS transistor shown in FIG. 17, that is, the LDMOS transistor in which the P type embedded diffusion region 91 is formed such that it is continued to the whole bottom surface of the P type body region 3, and its tip end reaches the inside of the N type drift region 5. Meanwhile, "$I_{body}$" on the leftmost side represents the avalanche current of the LDMOS transistor in this embodiment. Therefore, it can be seen from the formula 9 that the avalanche current of the LDMOS transistor in this embodiment can be smaller than the avalanche current of the conventional LDMOS transistor.

Figure 8:
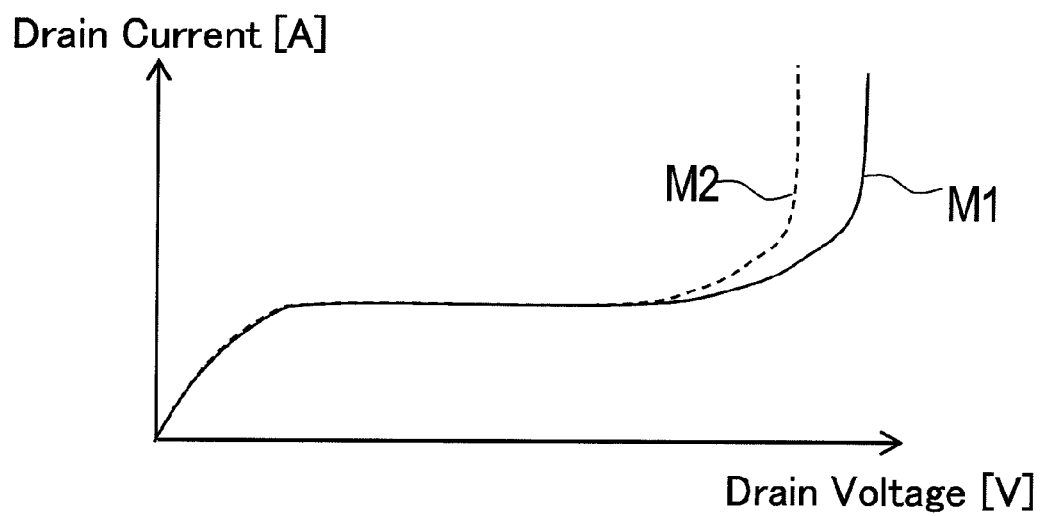
FIG. 8 is a graph to explain a relationship between the formation pattern of the embedded diffusion region and an avalanche current.

Therefore, as shown in FIG. 8, the LDMOS transistor (solid line M1) in which the P type embedded diffusion region 4 is continued to the partial bottom surface of the P type body region 3 in the shape of strips can reduce the avalanche current as compared with the case (broken line M2) where the P type embedded diffusion region is formed on the whole bottom surface of the P type body region 3 and its tip end reaches the inside of the N type drift region 5, and as a result, the on-breakdown voltage can be improved.

As described above, the LDMOS transistor in this embodiment can realize the high breakdown voltage without increasing the on resistance, by improving the mutual trade-off relationship among the off-breakdown voltage, the on-breakdown voltage, and the on resistance.

In addition, it is also preferable in this embodiment that concentration gradient is formed such that a concentration of the N type drift region 5 becomes high in a direction from L5 to L6 in FIG. 1B, that is, the direction from the gate edge toward the N type drain region 8. In this case, since the concentration of the N type drift region 5 is low in the vicinity of the gate edge in which the electric field is most likely to concentrate, the electric field relaxation can be promoted at the time of gate-off. On the contrary, since the concentration is high in the vicinity of the N type drain region 8 in which the electric field is most likely to concentrate at the time of gate-on, the electric field concentration due to the reach-through can be prevented. Thus, the trade-off relationship between the off-breakdown voltage and the on-breakdown voltage can be improved.

Hereinafter, a method for producing the LDMOS transistor in this embodiment will be described with reference to FIGS. 9A to 9C.

As shown in FIG. 9A, the N channel LDMOS transistor is formed in such a manner that the field oxide film (LOCOS oxide film) 11 is partially formed on the surface of the P type semiconductor substrate 1, and the P type body region 3 is formed by implanting a P type impurity such as boron. A length of LOCOS in FIG. 9A, that is, a drift length is set to be 6 μm or more when the high breakdown voltage of 100 V or more is to be realized.

Then, the P type embedded diffusion region 4 is formed by implanting a P type impurity such as boron. At this time, the impurity implantation is performed with a mask provided with alternate slits so as to form the region in which the P type impurity is implanted as shown in the cross-sectional view along the line L1-L2, and the region in which the P type impurity is not implanted as shown in the cross-sectional view along the line L3-L4. Implantation energy is set to be as high as 1 MeV or more. Thus, the P type embedded diffusion region 4 has the strip shape as shown in FIG. 1A.

Then, an N type impurity such as phosphorous is implanted away from the P type body region 3, with an implantation energy of 300 KeV or more, for example, whereby the N type drift region 5 is formed. This N type drift region 5 is formed in order to reduce the on resistance without lowering the breakdown voltage of the LDMOS transistor.

Then, as shown in FIG. 9B, the gate oxide film 13 is formed in a surface region of the P type semiconductor substrate 1 and then the gate electrode 14 is formed so as to partially stride an upper part of the P type body region 3 and an upper part of the N type drift region 5. In a step of forming the gate electrode 14, a polysilicon film doped with phosphorous is formed by a CVD method, and a resist is patterned thereon by a photo-etching technique, and then the polysilicon film is processed by a dry etching technique. In addition, since the field oxide film 11 is formed in this embodiment, the gate electrode 14 is formed so as to partially stride an upper layer of the field oxide film 11 positioned on the N type drift region 5.

Then, the N type source region 6 and the N type drain region 8 are formed by implanting phosphorus or arsenic, and the P type body contact region 7 is formed by implanting boron and the like.

Then, as shown in FIG. 9C, the interlayer insulation film 15 is formed on the surface by an atmospheric pressure CVD method, for example, and reflowed to reduce a surface step difference. Then, the interlayer insulation film 15 is subjected to contact etching over the gate electrode 14, the N type drain region 8, the N type source region 6, and the P type body contact region 7 to form an opening. Then, an aluminum film is grown by sputtering, and the aluminum film is patterned by photo-etching and dry etching, whereby metal electrodes (21 and 22) are formed.

In addition, in order to generate the concentration gradient in the N type drift region 5, after implanting the N type impurity ions to form the N type drift region 5, the concentration gradient in a lateral direction may be provided by heat diffusion at 950° C. or more, for example. Alternatively, the concentration gradient in the lateral direction may be generated by implanting different dose amount with a plurality of masks, at the time of N type impurity ion implantation.

Second Embodiment

A description will be made of a second embodiment of a semiconductor device according to the present invention, with reference to FIGS. 10A to 12. In addition, the same component as that in FIGS. 17A and 17B or in the first embodiment has the same reference in each of the following drawings and its description is omitted.

A LDMOS transistor in this embodiment is the same as that of the first embodiment in that the P type embedded diffusion region 4 is discretely connected to the partial bottom surface of the P type body region 3, and each discrete part extends toward the drift region 5 such that its tip end reaches the inside of the drift region 5 to form the strip-shape. Meanwhile, it is different from that of the first embodiment in that an N type diffusion region 2 is provided on the P type semiconductor substrate 1, and the P type body region 3 and the N type drift region 5 are formed on this N type diffusion region 2. Hereinafter, the N type diffusion region 2 is referred to as the "N type well 2".

According to this embodiment, since the N type well 2 (N type diffusion region) is formed between the P type body region 3 and the P type semiconductor substrate 1, the source region 8 is electrically separated well from the P type semiconductor substrate 1 (GND potential). Thus, as compared with the LDMOS transistor according to the first embodiment, the LDMOS transistor in this embodiment can be used even when the source electrode is required to have the breakdown voltage which is equivalent to a power supply voltage, with respect to the P type semiconductor substrate 1, so that it is effective because of a wide range of use on a circuit.

Figure 10A:
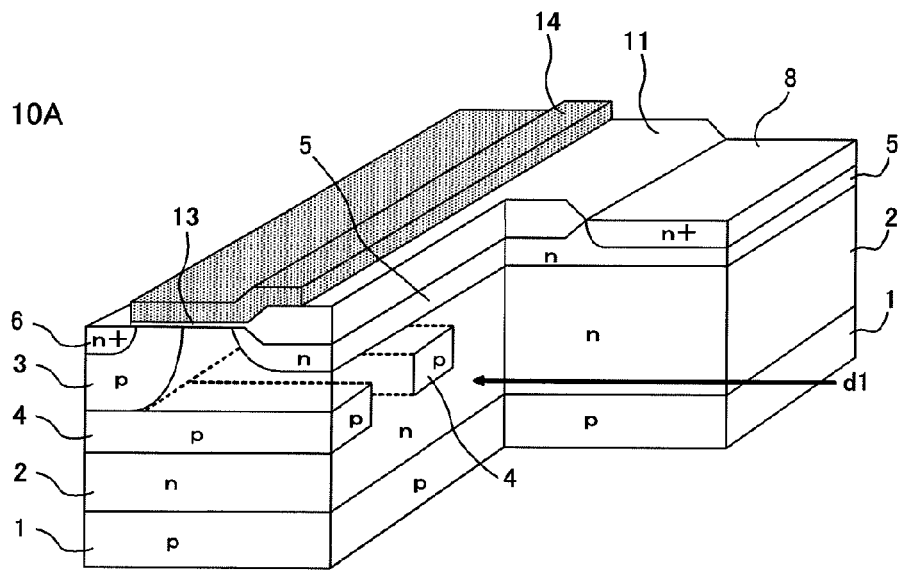
FIGS. 10A to 10C are schematic structure diagrams of an N channel LDMOS transistor according to a second embodiment.
Figure 10B:
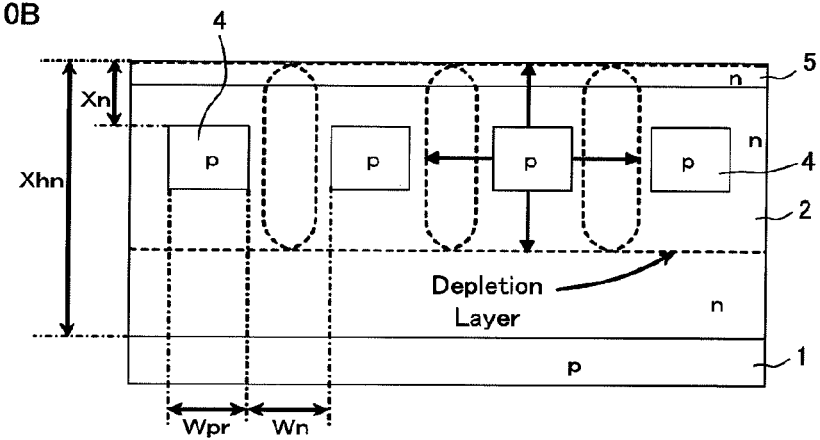

FIGS. 10A and 10B are schematic structure diagrams in which FIG. 10A is a three-dimensional schematic view, and FIG. 10B is a cross-sectional structure diagram provided by taking the three-dimensional schematic view in FIG. 10A from a direction d1. In addition, FIG. 10C is a cross-sectional structure diagram taken from the direction d1 in a case where the conventional LDMOS transistor (having the structure shown in FIGS. 17A and 17B) is shown like FIG. 10A, for comparison.

Figure 10C:
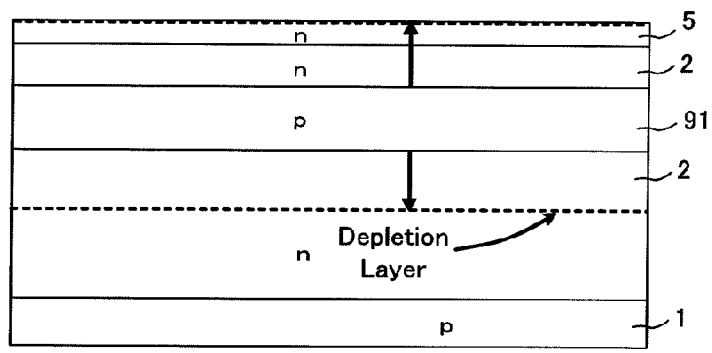
Figure 17A:
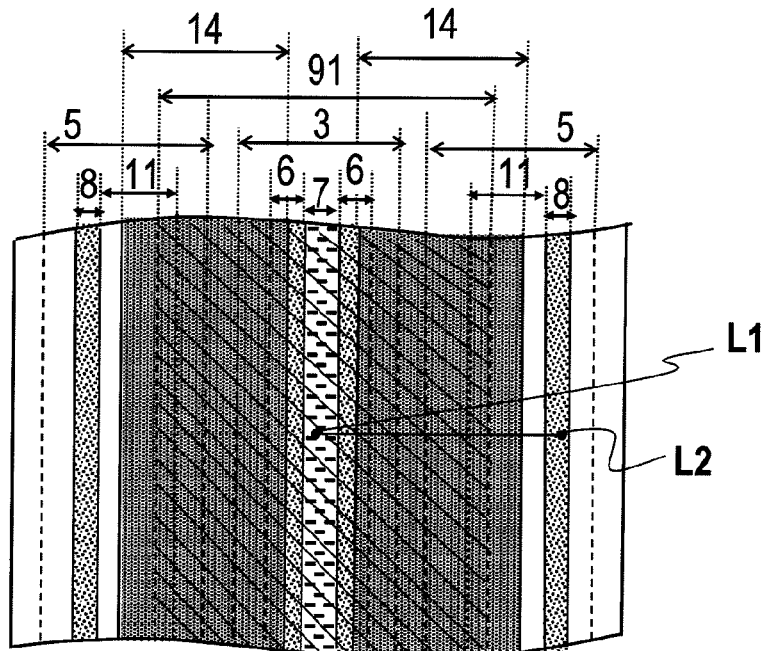
FIGS. 17A and 17B are schematic structure diagrams of a conventional N channel LDMOS transistor.
Figure 17B:
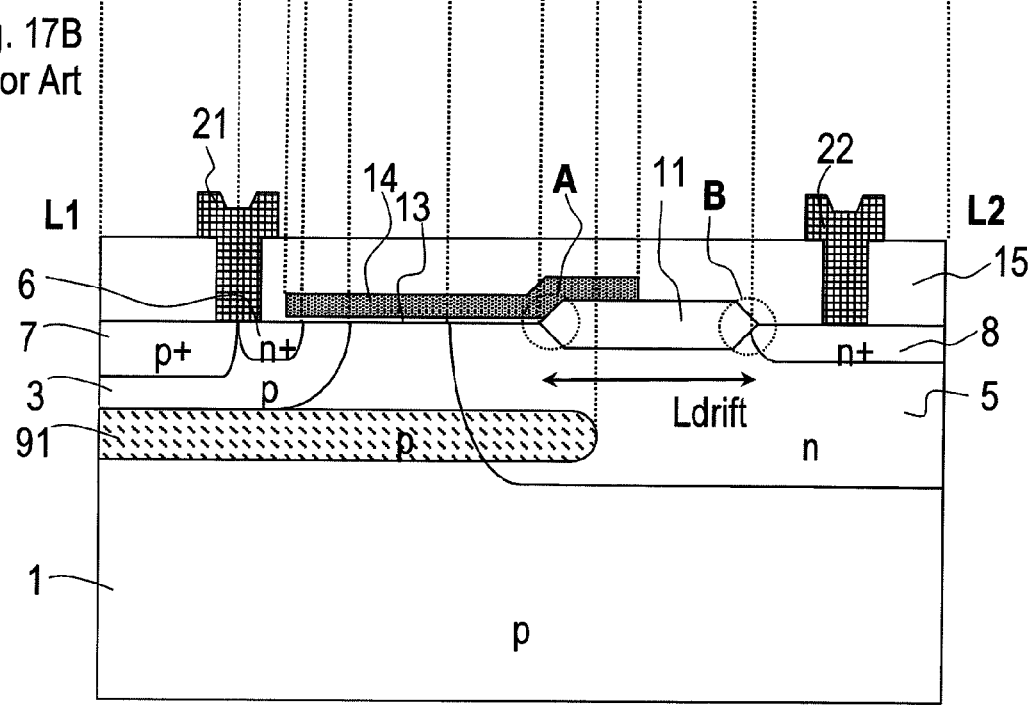
Figure 18:
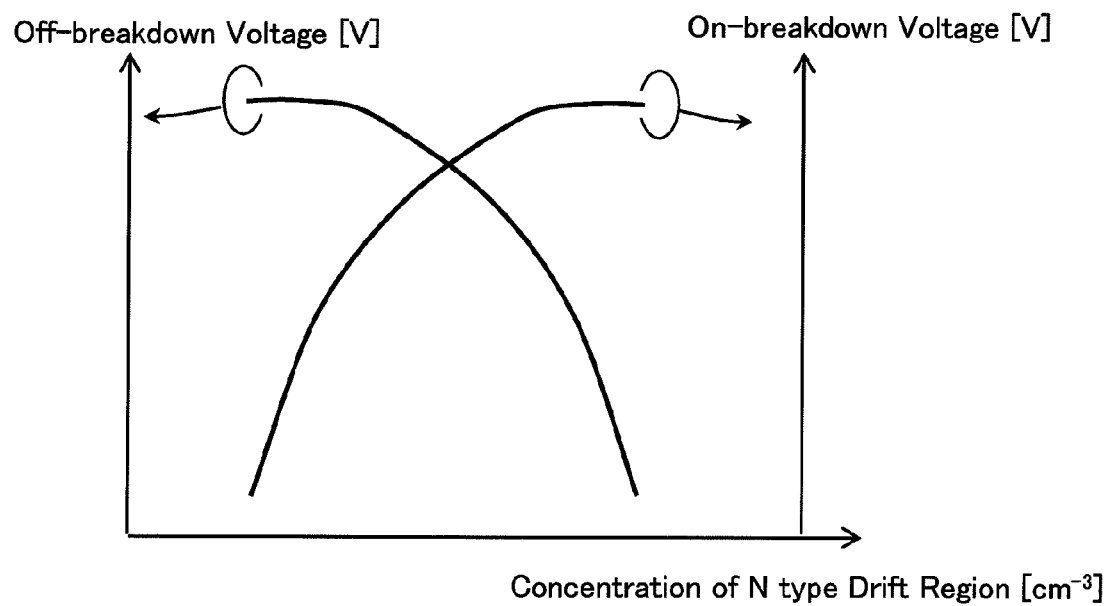
FIG. 18 is a view showing a trade-off relationship between the off-breakdown voltage and the on-breakdown voltage.
Figure 19:
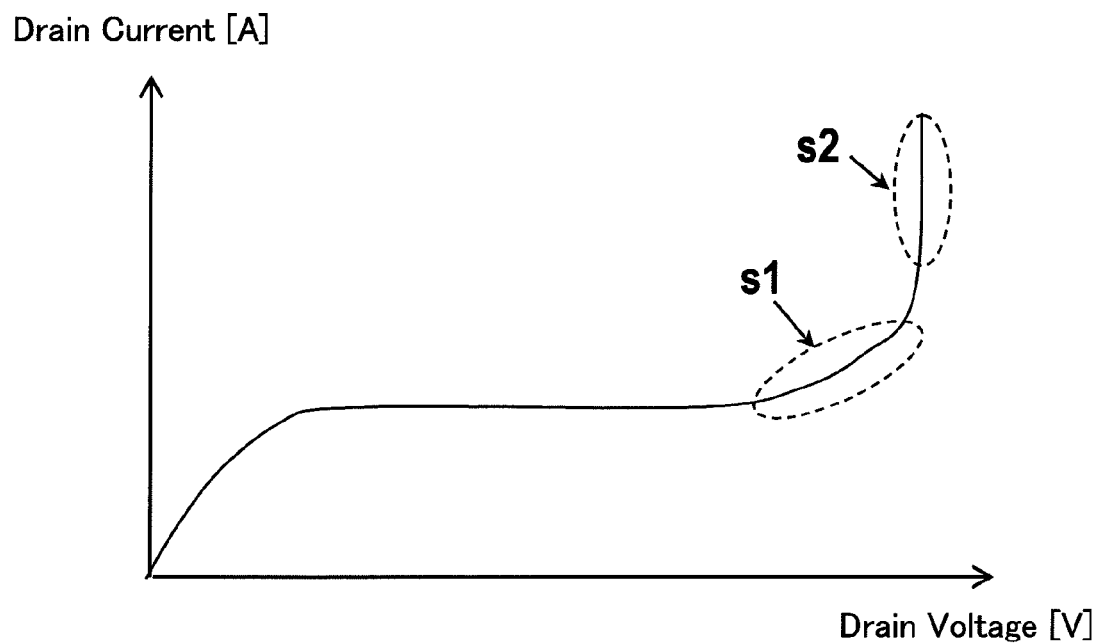
Figure 20:
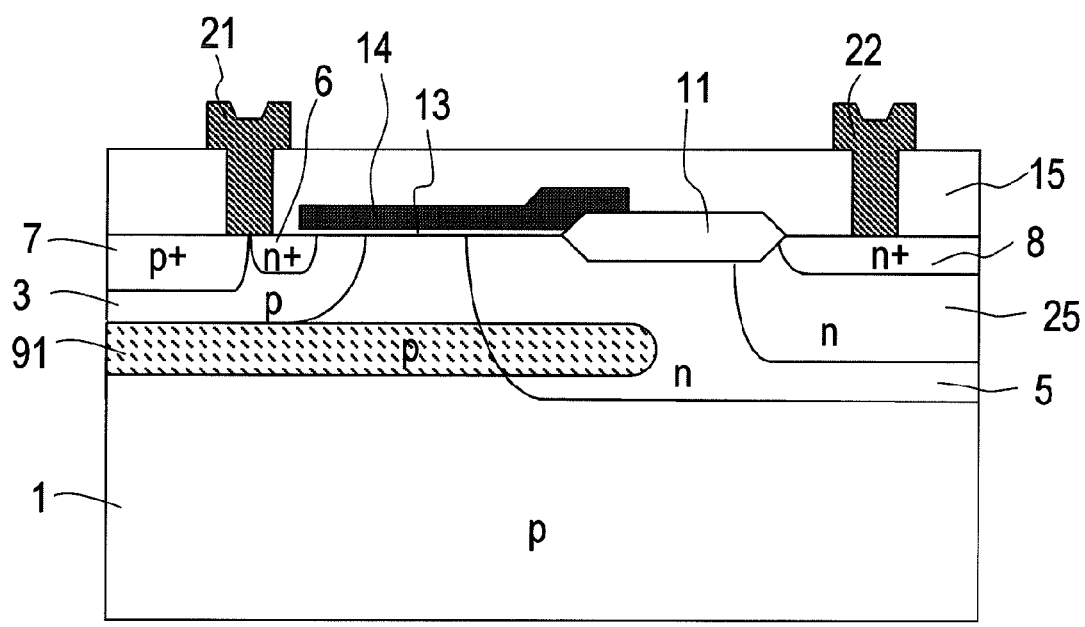
FIG. 20 is a schematic cross-sectional view of a conventional N channel LDMOS transistor improved in on-breakdown voltage.

As for the conventional LDMOS transistor shown in FIGS. 17A and 17B, that is, the LDMOS transistor having the conventional configuration in which the P type embedded diffusion region 91 is formed such that it is continued to the whole bottom surface of the P type body region 3 and its tip end reaches the inside of the N type drift region 5, as shown in FIG. 10C, when the drain voltage increases at the time of gate-off, the depletion layer extends on upper and lower sides of the P type embedded diffusion region 91 (broken line in the drawing). Thus, the N type drift region 5 positioned above the P type embedded diffusion region 91 is completely depleted, whereby the surface electric field is relaxed and the off-breakdown voltage increases.

Meanwhile, as for the LDMOS transistor in this embodiment, as shown in FIG. 10B, when the drain voltage increases at the time of gate-off, the depletion layer extends on upper and lower sides and right and left sides of the P type embedded diffusion region 4 (broken lines in the drawing). At this time, by appropriately adjusting the slit width Lslit and a depth Xn of the P type embedded diffusion region 4, the right and left sides and the upper side of the P type embedded diffusion region 4 can be completely depleted. Thus, when the surface electric field is relaxed in this way, the off-breakdown voltage can increase. The off-breakdown voltage depends on a ratio $\xi(=Lslit/Wpr)$ between a width Wpr of the P type embedded diffusion region 4 and the slit width Lslit, which will be described in detail below. In addition, Wn in FIG. 10B represents a width of the N type well 2 sandwiched between the strips of the P type embedded diffusion region 4, and this value corresponds to the formation interval Lslit of the P type embedded diffusion region 4.

In addition, as for the on-breakdown voltage, similar to the first embodiment, the avalanche current can be reduced as compared with the conventional configuration, so that the on-breakdown voltage can be improved. This is not described here because the description is a duplicate of the first embodiment.

Figure 11:
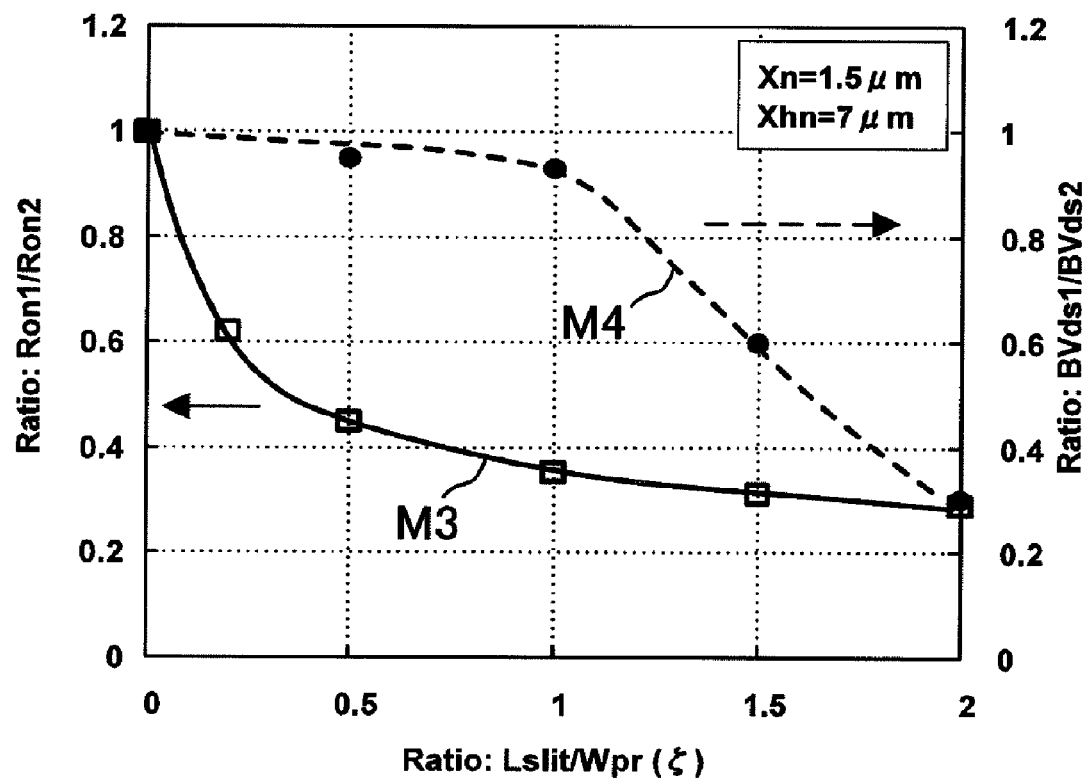
FIG. 11 is a graph showing a relationship between a ratio $\xi$ between a width and a slit width of the embedded diffusion region, and an on resistance ratio and an off-breakdown voltage ratio.

Next, the on resistance will be described with reference to FIGS. 10B and 11. FIG. 11 is a graph showing a relationship between an on resistance ratio and an off-breakdown voltage ratio, and the ratio $\xi$ (=Lslit/Wpr). In FIG. 11, a solid line M3 shows a relationship between the on resistance ratio and the ratio $\xi$, and a broken line M4 shows a relationship between the off-breakdown voltage ratio and the ratio $\xi$.

As shown in FIG. 10B, Xn represents the depth of the P type embedded diffusion region 4, Wpr represent the width thereof, Lslit represents the slit width thereof, and Xhn represents a depth of the N type well 2. In addition, the on resistance ratio Ron1/Ron2, wherein Ron1 represents the on resistance of the LDMOS transistor in this embodiment shown in FIG. 10B and Ron2 represents the on resistance of the conventional LDMOS transistor shown in FIG. 10C, depends on the ratio $\xi$ (=Lslit/Wpr) as shown in FIG. 11, that is, as the ratio 4 increases, the on resistance ratio can decrease. An increase in the value of the ratio means that the formation interval of the P type embedded diffusion region 4 increases with respect to the formation width thereof, and at this time, the region having the low resistance value of Rdrift increases as described in the first embodiment, so that the on resistance value decreases.

The off-breakdown voltage will be described. A breakdown voltage ratio BVds1/BVds2, wherein BVds1 represents the off-breakdown voltage of the LDMOS transistor according to this embodiment shown in FIG. 10B, and BVds2 represents the off-breakdown voltage of the conventional LDMOS transistor shown in FIG. 10C, depends on the ratio ξ (=Lslit/Wpr) as shown in FIG. 11, that is, as the radios increases, the off-breakdown voltage ratio decreases. In the case where the P type embedded diffusion region 4 is formed with intervals, as shown in FIG. 10B, the breakdown voltage can be ensured in a range that the depletion layer extending from the P type embedded diffusion region 4 can reach, but the breakdown voltage decreases in the region that the depletion layer cannot reach. Thus, it is found in FIG. 11 that when the slit width of the P type embedded diffusion region 4 becomes larger than the formation width thereof (ξ>1), the depletion layer extending from the P type embedded diffusion region 4 cannot reach some regions, and the breakdown voltage rapidly decreases therein.

Therefore, based on FIG. 11, the ratio ξ (=Lslit/Wpr) is preferably set to 1 or less in view of the off-breakdown voltage, and when ξ=0.5, for example, the on resistance ratio is 0.45 which means that the on resistance can considerably decrease while the off-breakdown voltage is kept high. In addition, this is applied to the structure of the first embodiment.

Figure 21:
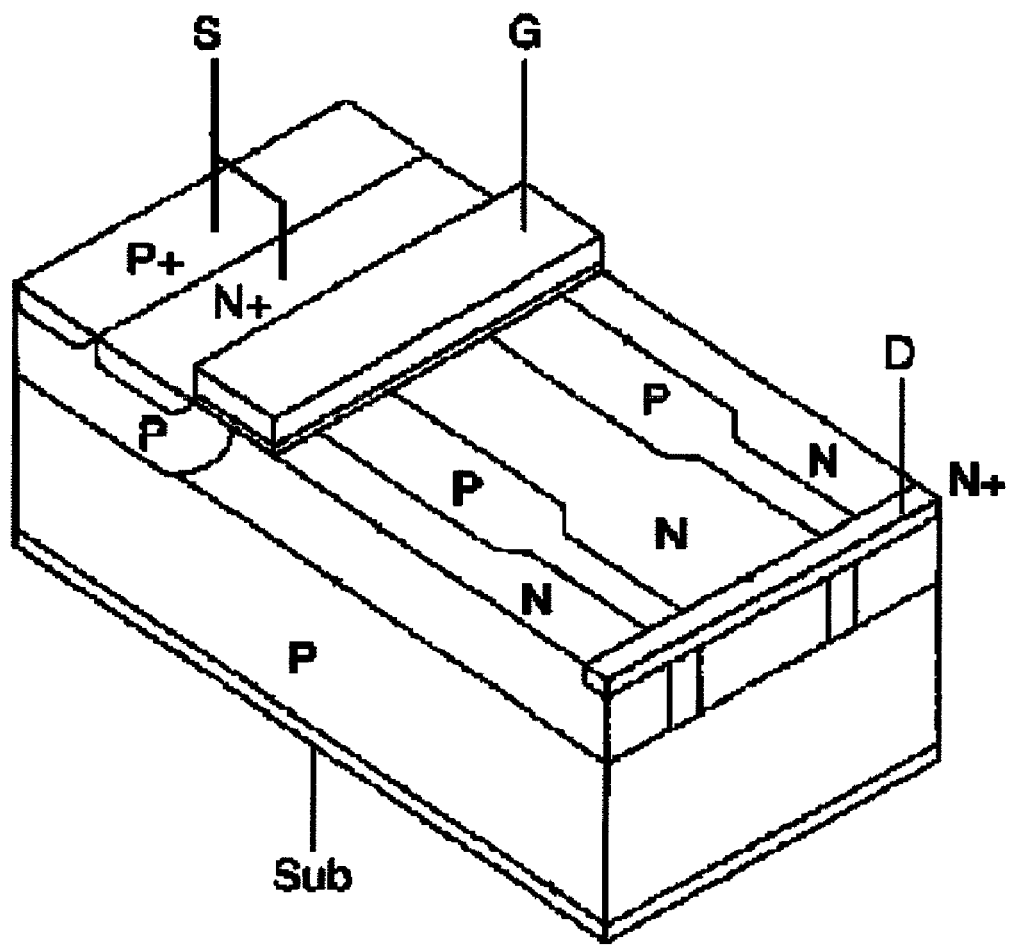
FIG. 21 is a schematic structure diagram of a conventional LDMOS transistor having a multi RESURF structure.

In addition, in recent years, as a device capable of improving the trade-off relationship between the off-breakdown voltage and the on resistance, a LDMOS transistor having a multi RESURF structure and a super junction structure is well-known as disclosed in Japanese Unexamined Patent Publication No. 2000-28617. As shown in FIG. 21, this kind of MOSFET is characterized in that the N type diffusion region and the P type diffusion region are provided in the form of a stripe-shape and alternately arranged as drift layers. This structure is characterized in that the drift layer can be easily depleted, and a concentration of the dose amount can be high in the drift layer, so that the on resistance can decrease.

However, since the P type diffusion region exists on the substrate surface in this conventional structure, a current at the time of gate-on flows only in the N type diffusion region. Meanwhile, according to this embodiment, as shown in FIG. 10B, since the P type diffusion region is formed as the embedded diffusion region 4, it is advantageous in that the current at the time of the gate-on flows in the N type well 2 formed on the top surface of the P type embedded diffusion region 4, and in the N type well 2 formed between the separated parts of the P type embedded diffusion region 4, so that the on resistance can decrease.

By the way, the RESURF effect due to the P type embedded diffusion region 4 largely depends on the effective impurity concentration of the P type embedded diffusion region 4, and the concentration is optimized based on the concentration of the N type drift region 5. Like the first embodiment, when the N type drift region 5 is formed deeper than the P type embedded diffusion region 4, it is supposed that the impurity concentration of the P type embedded diffusion region 4 is negated by the N type drift region 5, so that the effective impurity concentration of the P type embedded diffusion region 4 decreases to a certain degree. Therefore, it is necessary to design the LDMOS transistor in view of the decrease in concentration.

However, as shown in FIG. 10A, according to this embodiment, since the N type well 2 is provided, the N type drift region 5 can be formed shallowly as compared with the P type embedded diffusion region 4. In this case, the effect of the concentration of the N type drift region 5 on the effective concentration of the P type embedded diffusion region 4 can be smaller as compared with the first embodiment, so that the design of the LDMOS transistor can be simplified. Furthermore, even when the concentration of the N type drift region 5 varies during its production process, the effect on the effective concentration of the P type embedded diffusion region 4 can be small, so that the LDMOS transistor showing stable electric characteristics can be provided.

In addition, according to this embodiment, the concentrations of the N type drift region 5 and the N type well 2 can be separately set. Therefore, the on resistance can decrease by setting the concentration of the N type drift region 5 to be high, and the off-breakdown voltage can be prevented from decreasing by setting the concentration of the N type well 2 to be lower than that of the N type drift region 5. In order to prevent the off-breakdown voltage from decreasing, it is necessary to completely deplete the upper and right and left sides of the P type embedded diffusion region 4 as shown in FIG. 10B. However, according to the configuration of this embodiment, this can be realized by adjusting the implantation depth Xn of the P type embedded diffusion region as for the upper side, and by setting the concentration of the N type well 2 to be low as for the right and left sides.

Thus, the N type drift region 5 is positioned over the P type embedded diffusion region 4, and its concentration is higher than that of the N type well 2 formed in the right and left sides of the P type embedded diffusion region 4, then it is difficult to completely deplete this part. Therefore, in view of the off-breakdown voltage only, it is preferable to set the depth Xn of the P type embedded diffusion region to be small. However, in the case where the implantation depth Xn is shallow, what we call a quasi-saturation phenomenon emerges. The quasi-saturation phenomenon is the phenomenon that the drain current at the time of gate-on is not saturated by pinch-off of a channel like in the normal MOS transistor, but saturated by electron saturation speed of the drift region 5, and the problem is that the phenomenon not only causes a saturation current value of the drain current to decrease but also causes the on resistance to increase.

Figure 12:
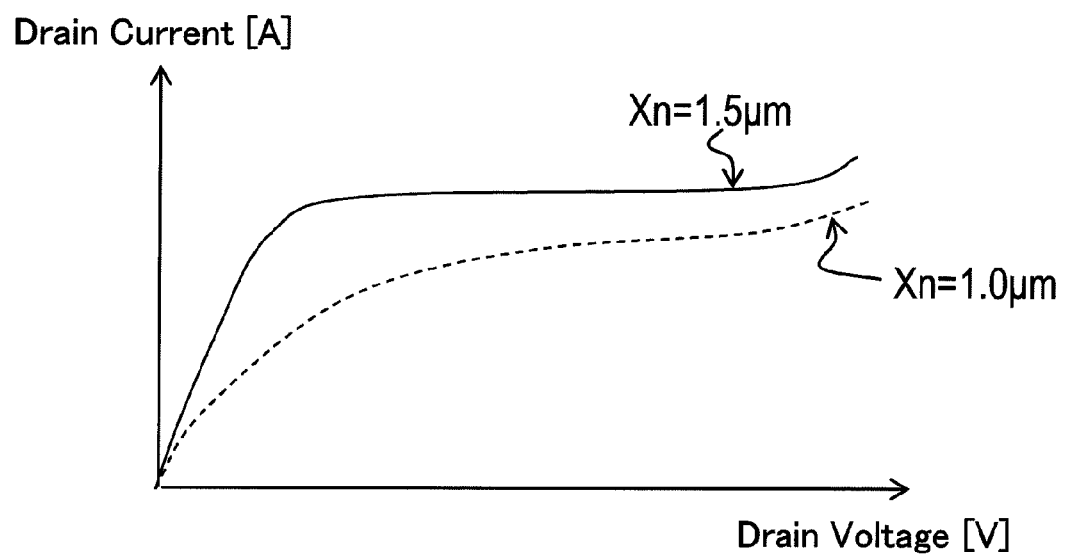
FIG. 12 is a graph showing a relationship between an implantation depth of the embedded diffusion region and the on resistance.

FIG. 12 shows relationships between the drain voltage and the drain current at the time of gate-on when Xn=1 μm and when Xn=1.5 μm. In addition, the concentration of the N type drift region 5 is optimized to equalize the off-breakdown voltage in a graph in FIG. 12.

As shown in FIG. 12, in the case where Xn=1.5 μm, a saturation current value of the drain current is kept high, and the on resistance can be low as compared with the case where Xn=1 μm. Therefore, the implantation depth Xn of the P type embedded diffusion region 4 is preferably set such that Xn≧1.5 μm. This is applied to the configuration of the first embodiment.

Hereinafter, a method for producing the LDMOS transistor in this embodiment will be described with reference to FIGS. 13A to 13D. In addition, similar to the case in FIGS. 9A to 9C cross-sectional views in which the P type embedded diffusion region 4 is formed (cross-sectional views taken along the line L1-L2) and cross-sectional views in which the P type embedded diffusion region 4 is not formed (cross-sectional views taken along the line L3-L4) are lined up.

As shown in FIG. 13A, this N channel LDMOS transistor is formed in such a manner that an N type impurity is implanted in the P type semiconductor substrate 1, and the N type well 2 is formed to have a predetermined depth by thermal diffusion such as high-temperature drive-in. As the N type impurity, phosphorous is used, for example and implantation energy is 2 MeV or more, and a dose amount is $1.0 \times 10^{13}$ cm$^{-2}$ or less. In addition, an impurity implantation region is defined by being patterned so that implantation region is opened by a photo-etching technique and the like, with a thick resist which corresponds to the high energy implantation. Then, the field oxide film (LOCOS oxide film) 11 is partially formed on the surface of the N type well 2. A drift length is set to be 6 μm or more in order to realize a high breakdown voltage of 100 V or more. In addition, in the configuration in FIGS. 13A to 13D, a length (LOCOS length) of the field oxide film 11 from the source region 6 to the drain region 8 corresponds to the drift length.

Then, as shown in FIG. 13B, the P type body region 3 is formed by implanting a P type impurity such as boron. Then, the P type embedded diffusion region 4 is formed by implanting the P type impurity such as boron. At this time, the impurity implantation is performed with a mask provided with alternate slits to form the region that is implanted with the P type impurity as shown in the L1-L2 cross-sectional view and the region that is not implanted with the P type impurity as shown in the L3-L4 cross-sectional view. Implantation energy is set to be as high as 1 MeV or more. Thus, the P type embedded diffusion region 4 has the strip-shape as shown in FIG. 1A.

Then, as shown in FIG. 13C, the N type drift region 5 is formed by implanting an N type impurity such as phosphorus into a position away from the P type body region 3, with implantation energy of 300 KeV or more, for example. This N type drift region 5 is formed in order to reduce the on resistance without lowering the breakdown voltage of the LDMOS transistor.

In addition, in the case where the N type drift region 5 is formed shallowly as compared with the P type embedded diffusion region 4, the respective impurity ion implantation conditions thereof are set so that a depth of the N type drift region 5 becomes 1 μm or less, for example and a depth of the P type embedded diffusion region 4 becomes 1.5 μm or more, for example. In addition, in the case where the concentration of the N type well 2 is set to be lower than that of the N type drift region 5, for example, the concentration of the N type well 2 is set to be $3.0 \times 10^{16}$ cm$^{-3}$ or less, and the concentration of the N type drift region 5 is set to be $3.0 \times 10^{16}$ cm$^{-3}$ or more so that they are not more than impurity concentrations of the N type source/drain regions (6 and 8).

Then, similar to the first embodiment, the gate oxide film 13 and the gate electrode 14 are formed, and as shown in FIG. 13D, the N type source region 6 and the N type drain region 8 are formed by implanting phosphorus or arsenic, for example, and the P type body contact region 7 is formed by implanting boron. Then, the interlayer insulation film 15 and metal electrodes (21 and 22) are formed.

In addition, in this embodiment also, similar to the first embodiment, it is preferable to form concentration gradient so that the concentration of the N type drift region 5 becomes high in a direction from a gate edge to the N type drain region 8. A method for this is the same method as described in the first embodiment.

Other Embodiments

Hereinafter, other embodiments will be described.

Figure 14A:
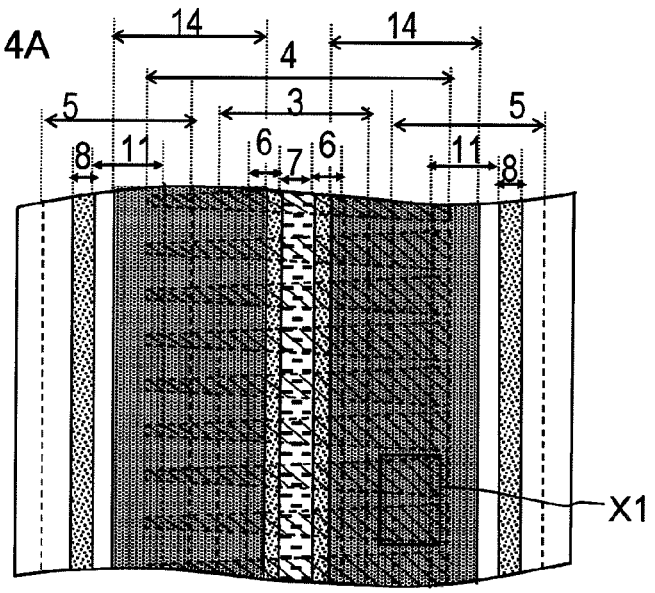
FIGS. 14A to 14C are schematic structure diagrams of an N channel LDMOS transistor according to another embodiment.
Figure 14B:
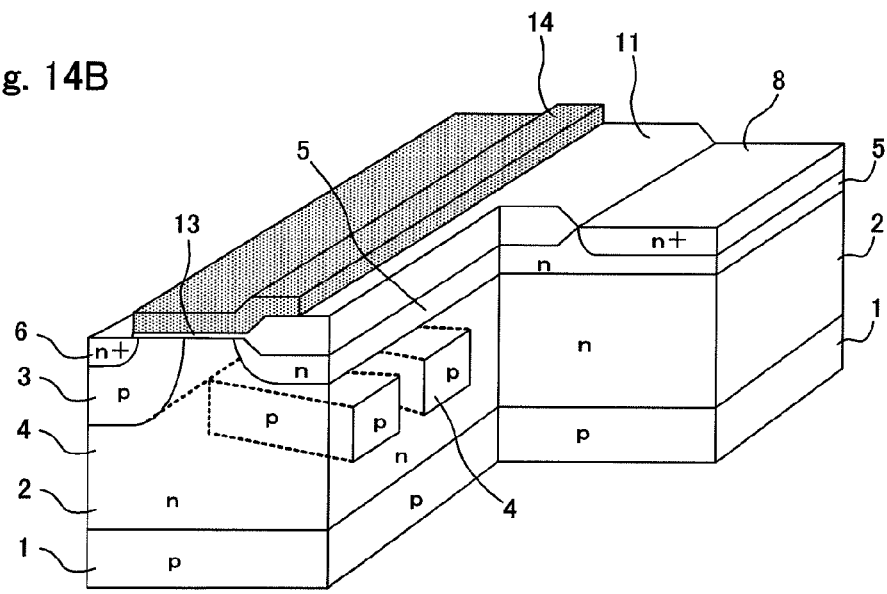
Figure 14C:
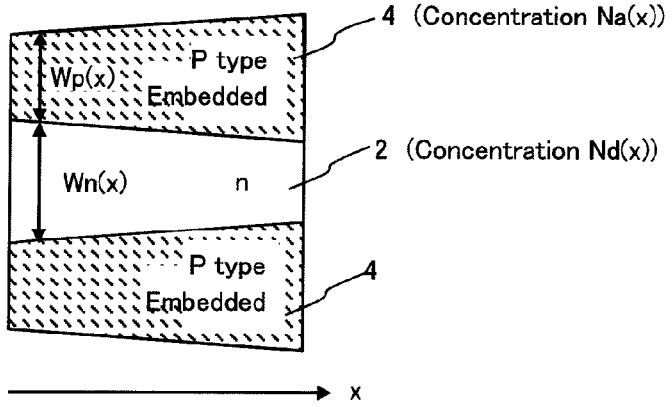

(1) As shown in FIGS. 14A to 14C, the slit-shape of the P type embedded diffusion region 4 may be a trapezoid-shape. In this case, it is preferable that a width Wp (x) of the P type embedded diffusion region 4 increases toward the N type drain region 8, and on the contrary, a width Wn (x) of the N type drift region 5 decreases toward the N type drain region 8. FIG. 14A shows a top schematic view, and FIG. 14B shows a three-dimensional view. In addition, FIG. 14C is a schematically enlarged view of a region X1 in FIG. 14A.

In general, in order to realize the high breakdown voltage with the super junction structure, it is necessary to completely deplete the N type region and the P type region arranged alternately, and in order to completely deplete them, it is necessary to satisfy the following formula 10, wherein Na (x) represents the concentration of the P type embedded diffusion region, Nd (x) represents the concentration of the N type drift region.

$$Na(x) \times Wp(x) = Nd(x) \times Wn(x) \qquad (10)$$

Therefore, according to this other embodiment, it is preferable to form the P type embedded diffusion region 4 so that its concentration becomes low toward the N type drain region 8, and on the contrary, to form the N type drift region 5 so that its concentration becomes high toward the N type drain region 8.

As described above, it is important to relax the electric field at the gate edge at the time of off-breakdown voltage, and since the gate electrode 14 exists above the gate edge, the electric field can be sufficiently relaxed due to a field plate effect of the gate electrode 14 even when an assist by the P type embedded diffusion region 4 is small. Therefore, the width Wp of the P type embedded diffusion region 4 is formed to be small in the vicinity of the gate edge, while the width Wp of the P type embedded diffusion region 4 is formed to be large in the vicinity of the N type drain region 8 in which the field plate effect is small. Thus, when the width Wp (x) and the impurity concentration Na (x) of the P type embedded diffusion region 4 are optimized, the impurity concentration Nd (x) of the N type drift region 5 can be higher, or the width Wn (x) of the N type drift region 5 can be larger as a whole, for example, so that the resistance value of the N type drain region 5 can decrease, so that the on resistance can decrease.

In addition, while the description has been made of the case where the N type well 2 is formed, with reference to FIGS. 14A to 14C in this other embodiment, similar to FIGS. 10A and 10B in the second embodiment, this embodiment can be applied to the case where the N type well 2 is not formed, like the configuration of the first embodiment.

(2) While the description has been made of the case where the P type embedded diffusion region 4 is configured into the strip-shape in the first embodiment, the P type embedded diffusion region 4 only have to be discretely formed at least in the N type drift region 5 and between the P type body region 3 and the N type drift region 5.

Figure 15A:
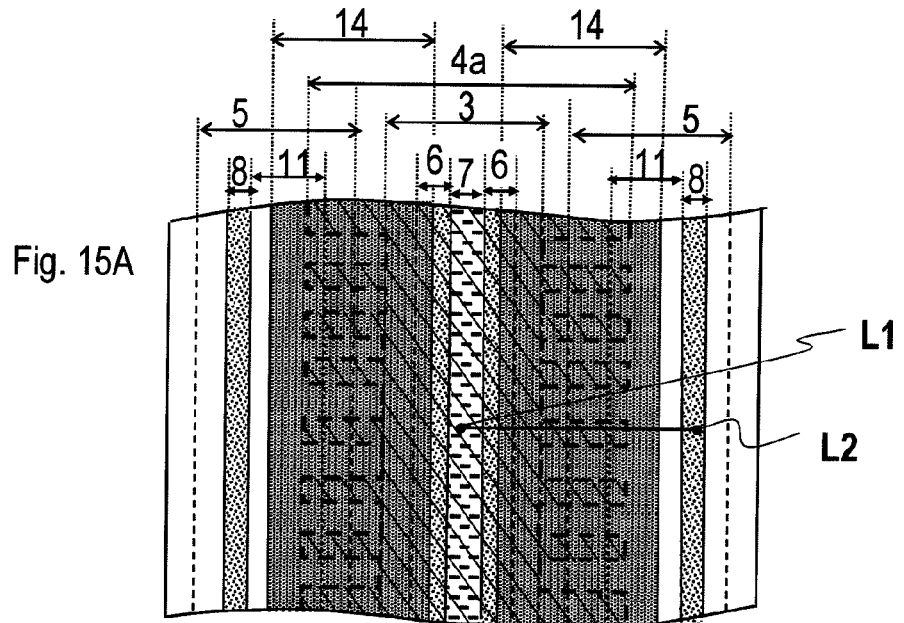
FIGS. 15A and 15B are schematic structure diagrams of an N channel LDMOS transistor according to another embodiment.
Figure 15B:
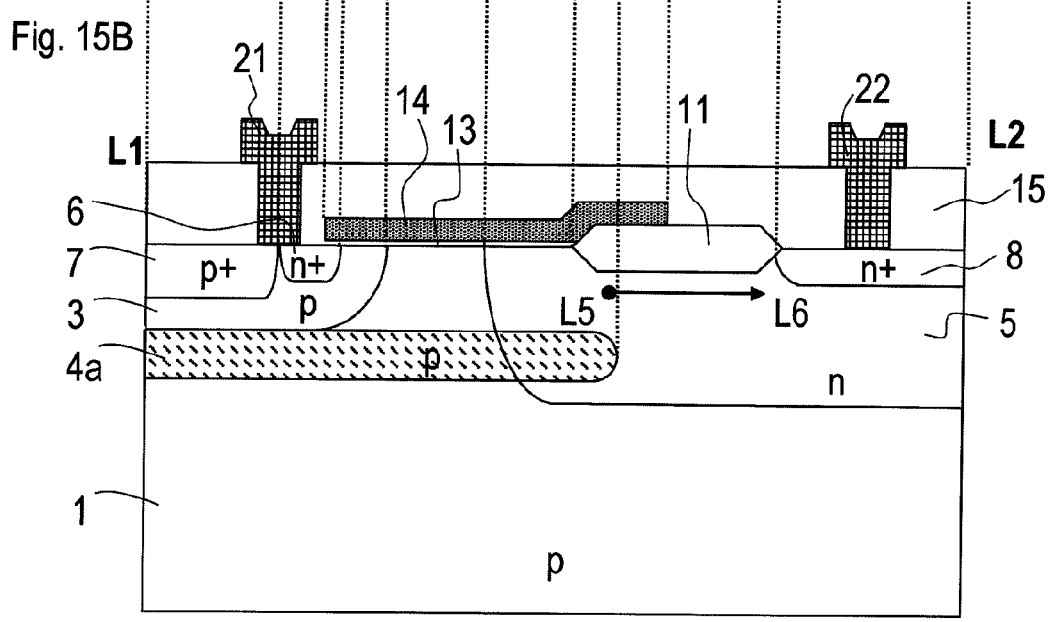
Figure 16A:
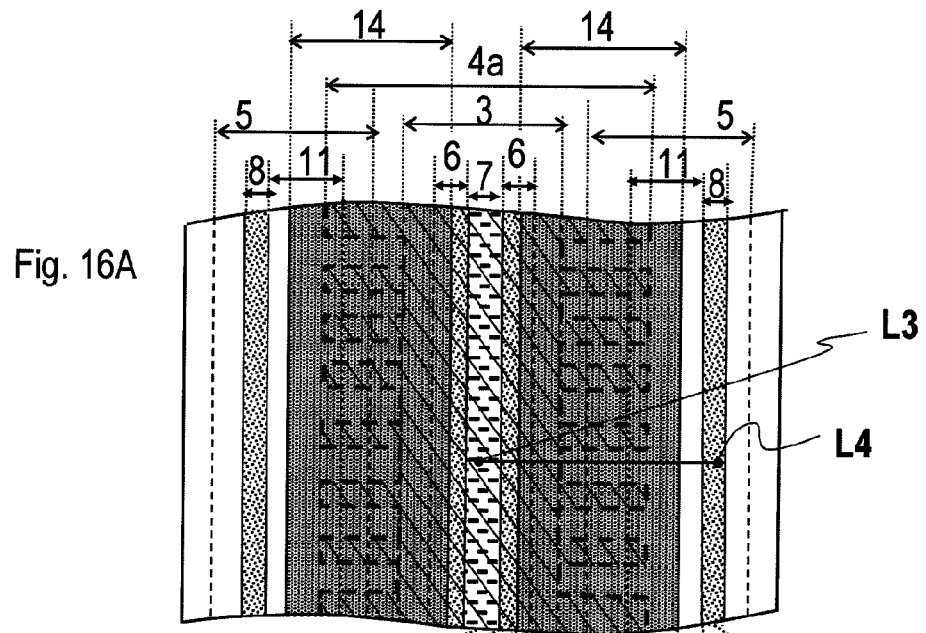
FIGS. 16A and 16B are schematic structure diagrams of an N channel LDMOS transistor according to the other embodiment.
Figure 16B:
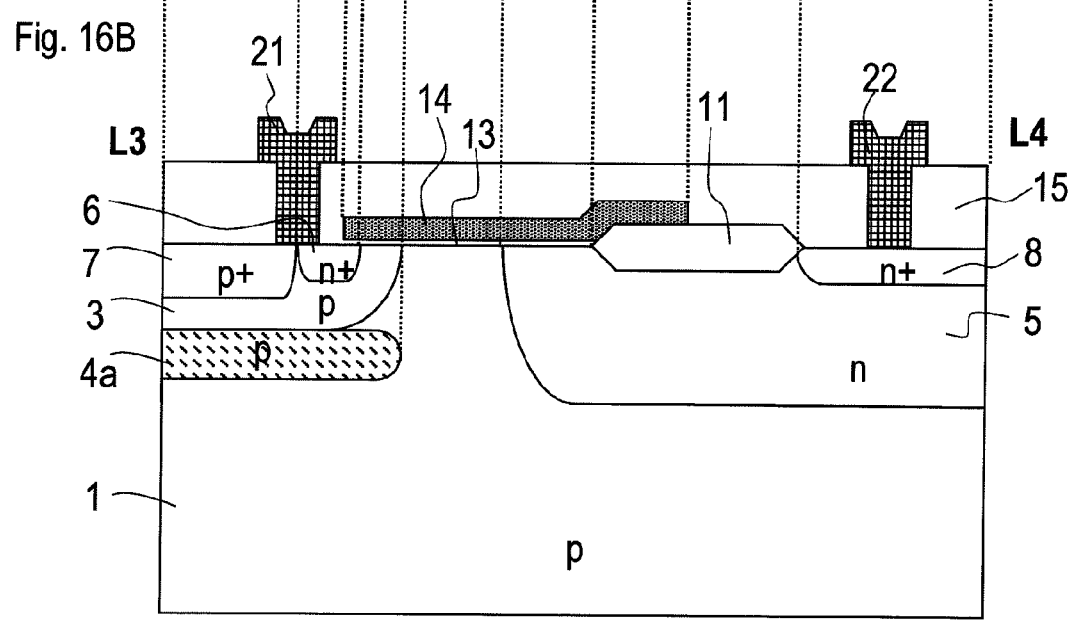

That is, the P type embedded diffusion region 4 may be formed such that it is connected to the whole bottom surface of the P type body region 3 in the bottom position of the P type body region 3, while it discretely extends from the P type body region 3 to the N type drift region 5 to form a plurality of projections, and a tip end of each projection reaches the inside of the N type drift region 5 in the position outside the P type body region 3 (side of the N type drain region 8). FIGS. 15A to 16B show schematic structure diagrams in this case like FIGS. 1A to 2B. FIGS. 15A and 16A are top schematic views and both are totally the same. While FIG. 15B and FIG. 16B are cross-sectional schematic views, they are different in cut positions, and FIG. 15B shows a cross-section cut along a line L1-L2, and FIG. 16B shows a cross-section cut along a line L3-L4.

According to this other embodiment, since the P type embedded diffusion region 4 is formed on the whole bottom surface of the P type body region 3, the P type embedded diffusion region 4 is shown in the cross-sectional view taken along the line L3-L4, unlike FIG. 2B. Meanwhile, since the P type embedded diffusion region 4 is discretely formed, it is not shown in the position in which the P type body region 3 and the N type drift region 5 are opposed to each other, and in the N type drift region 5 in the cross-sectional view taken along the line L3-L4, like FIGS. 1A to 2B.

Thus, the P type embedded diffusion region 4 is formed into a comb-shape, and it is discretely formed in the N type drift region 5, and between the P type body region 3 and the N type drift region 5 similar to the structure of the first embodiment shown in FIGS. 1A to 2B, so that the electric field concentration part is discretely formed similar to FIG. 7A. Thus, in the structure of this other embodiment also, the drain current can separately flow in the current path passing through the electric field concentration part, and the current path not passing through the electric field concentration part, so that the drain current (avalanche current) can be small, and the on-breakdown voltage can be improved, as compared with the conventional configuration shown in FIG. 17 in which the P type embedded diffusion region 91 is wholly embedded.

Similarly, in the case of the configuration of the second embodiment, the P type embedded diffusion region 4 only has to be discretely formed at least in the N type well 2 under the N type drift region 5, and in the N type well 2 under a position between the P type body region 3 and the N type drift region 5. That is, in the bottom position of the P type body region 3, the P type embedded diffusion region 4 may be connected to the whole bottom surface of the P type body region 3, and while in the position outside the P type body region 3 (side of the N type drain region 8), it may discretely extend from the P type body region 3 to the N type drift region 5 to form a plurality of projections, and a tip end of each projection may reach the inside of the N type well 2 provided under the N type drift region 5.

(3) In the above embodiments, the description has been made of the case where the field oxide film 11 is formed and the gate electrode 14 is partially formed thereon. However, the present invention can achieve the same effect without the field oxide film 11, by forming the gate oxide film 13 so as to be commonly overlapped on a part of the P type body region 3 and on a part of the N type drift region 5, and forming the gate electrode 14 thereon.

(4) In each of the above embodiments, the slit width (formation interval) of the P type embedded diffusion region 4 may not be provided at regular intervals.

(5) While the description has been made of the N channel LDMOS transistor having the P type body region and the N type source/drain regions on the P type semiconductor substrate in the above embodiments, a P channel LDMOS transistor can achieve the same effect by inverting each polarity.

(6) While it is assumed that the source region 7 is surrounded by the drain region 8 in the above embodiments, the positional relationship between the source region 7 and the drain region 8 may be reversed. In this case, the P type body region 3 surrounds the N type drift region 5.

(7) While the high-concentration P type body contact region 7 is formed in the body region 3 to reduce the contact resistance between the source electrode 21 and the body region 3 in the above embodiments, the LDMOS transistor can be improved in the mutual trade-off relationships among the off-breakdown voltage, on-breakdown voltage, and on resistance even when the body contact region 7 is not formed.

Although the present invention has been described in terms of a preferred embodiment, it will be appreciated that various modifications and alterations might be made by those skilled in the art without departing from the invention. The invention should therefore be measured in terms of the claims which follow.

What is claimed is:

1. A semiconductor device comprising:
   a semiconductor substrate having a first conductivity type;
   a body region having the first conductivity type, formed in the semiconductor substrate;
   a drift region having a second conductivity type, formed away from the body region in a direction parallel to a surface of the semiconductor substrate, in the semiconductor substrate;
   a drain region having the second conductivity type, formed in the drift region so as to have a concentration higher than that of the drift region;
   a source region having the second conductivity type, formed in the body region so as to have a concentration higher than that of the drift region;
   a buried diffusion region having the first conductivity type, formed so as to be connected to a bottom surface of the body region, and to have a plurality of projections extending from the body region in a first direction in which the drift region and the body region are separated from each other such that each tip end of the projections reaches an inside of the drift region;
   a gate oxide film formed so as to be commonly overlapped on a part of the body region and a part of the drift region; and
   a gate electrode formed on the gate oxide film.

2. The semiconductor device according to claim 1, further comprising
   a well having the second conductivity type, in the semiconductor substrate, wherein
   each of the body region, the drift region, and the buried diffusion region is formed in the well.

3. The semiconductor device according to claim 2, wherein the well region has a concentration lower than that of the drift region.

4. The semiconductor device according to claim 1, wherein the buried diffusion region is formed into a strip-shape composed of a plurality of parts each of which is connected to a part of the bottom surface of the body region and extends in the first direction to form each of the plurality of projections.

5. The semiconductor device according to claim 1, wherein the buried diffusion region is formed into a comb-shape so as to be connected to the whole bottom surface of the body region, and have the plurality of projections extending from the body region in the first direction.

6. The semiconductor device according to claim 1, wherein the plurality of projections of the buried diffusion region are formed so as to have a slit width at regular intervals in a second direction parallel to the surface of the semiconductor substrate and perpendicular to the first direction, and
   the slit width is set to be equal to or less than ½ time a distance in the first direction between the gate electrode formed on the gate oxide film and the drain region.

7. The semiconductor device according to claim 1, wherein the plurality of projections of the buried diffusion region are formed away from each other so as to have a slit width at regular intervals in a second direction parallel to the surface of the semiconductor substrate and perpendicular to the first direction, and the slit width is set to be equal to or less than a width of the plurality of projections of the buried diffusion region in the second direction.

8. The semiconductor device according to claim 1, wherein the drift region is formed so as to have concentration gradient such that an impurity concentration becomes higher from a position under a gate edge serving as an end of the gate electrode formed on the gate oxide film on a side of the drain region, toward the drain region.

9. The semiconductor device according to claim 1, wherein the buried diffusion region is formed so as to broaden in a second direction parallel to the surface of the semiconductor substrate and perpendicular to the first direction, from the bottom surface of the body region to the drain region.

10. The semiconductor device according to claim 1, wherein the buried diffusion region is formed at a depth of 1.5 μm or more from the surface of the semiconductor substrate.

11. A semiconductor device comprising:
a semiconductor substrate having a first conductivity type;
a well region having a second conductivity type, formed in the semiconductor substrate;
a body region having the first conductivity type, formed in the well region;
a drift region having the second conductivity type, formed away from the body region in a direction parallel to a surface of the semiconductor substrate, in the well region;
a drain region having the second conductivity type, formed in the drift region so as to have a concentration higher than that of the drift region;
a source region having the second conductivity type, formed in the body region so as to have a concentration higher than that of the drift region;
a buried diffusion region having the first conductivity type, formed so as to be connected to a bottom surface of the body region, and have a plurality of projections extending from the body region in a first direction in which the drift region and the body region are separated from each other such that each tip end of the projections reaches a position under the drift region;
a gate oxide film formed so as to be commonly overlapped on a part of the body region and a part of the drift region; and
a gate electrode formed on the gate oxide film.

12. The semiconductor device according to claim 11, wherein the well region has a concentration lower than that of the drift region.

13. The semiconductor device according to claim 11, wherein the buried diffusion region is formed into a strip-shape composed of a plurality of parts each of which is connected to a part of the bottom surface of the body region and extends in the first direction to form each of the plurality of projections.

14. The semiconductor device according to claim 11, wherein the buried diffusion region is formed into a comb-shape so as to be connected to the whole bottom surface of the body region, and have the plurality of projections extending from the body region in the first direction.

15. The semiconductor device according to claim 11, wherein the plurality of projections of the buried diffusion region are formed so as to have a slit width at regular intervals in a second direction parallel to the surface of the semiconductor substrate and perpendicular to the first direction, and
the slit width is set to be equal to or less than ½ time a distance in the first direction between the gate electrode formed on the gate oxide film and the drain region.

16. The semiconductor device according to claim 11, wherein the plurality of projections of the buried diffusion region are formed away from each other so as to have a slit width at regular intervals in a second direction parallel to the surface of the semiconductor substrate and perpendicular to the first direction, and
the slit width is set to be equal to or less than a width of the plurality of projections of the buried diffusion region in the second direction.

17. The semiconductor device according to claim 11, wherein the drift region is formed so as to have concentration gradient such that an impurity concentration becomes higher from a position under a gate edge serving as an end of the gate electrode formed on the gate oxide film on a side of the drain region, toward the drain region.

18. The semiconductor device according to claim 11, wherein the buried diffusion region is formed so as to broaden in a second direction parallel to the surface of the semiconductor substrate and perpendicular to the first direction, from the bottom surface of the body region to the drain region.

19. The semiconductor device according to claim 11, wherein the buried diffusion region is formed at a depth of 1.5 μm or more from the surface of the semiconductor substrate.

20. A method for producing a semiconductor device comprising:
forming a body region by implanting impurity ions having a first conductivity in a semiconductor substrate having a first conductivity type, and forming a drift region by implanting impurity ions having a second conductivity type in a position on the semiconductor substrate away from the body region in a direction parallel to a surface of the semiconductor substrate, the steps of forming the body region and forming the drift region being performed in a random order;
forming a buried diffusion region so as to be connected to a bottom surface of the body region, and have a plurality of projections extending from the body region in a first direction in which the drift region and the body region are separated from each other such that each tip end of the projections reaches the drift region, by implanting an impurity ion having the first conductivity type with implantation energy higher than that used when the body region is formed, using a mask pattern provided with a plurality of slits arranged in a direction parallel to the surface of the semiconductor substrate and perpendicular to the first direction;
forming a source region and a drain region in the body region and the drift region, respectively by implanting impurity ions having the second conductivity type and having a concentration higher than that of the drift region, in the body region and the drift region; and
forming a gate oxide film so as to be commonly overlapped at least on a part of the body region and a part of the drift region, by oxidizing the surface of the semiconductor substrate and forming a gate electrode on the gate oxide film.

21. The method for producing the semiconductor device according to claim 20, further comprising
forming a well region having a concentration lower than that of the drift region by implanting impurity ions having the second conductivity type in the semiconductor substrate before the body region and the drift region are formed, wherein
the body region and the drift region are formed in the well region.

22. A method for producing a semiconductor device comprising:
forming a well region by implanting impurity ions having a second conductivity type in a semiconductor substrate having a first conductivity type;
forming a body region by implanting impurity ions having the first conductivity type in the well region, and forming a drift region by implanting impurity ions having the second conductivity type in a position of the well region away from the body region in a direction parallel to a surface of the semiconductor substrate, the steps of forming the body region and forming the drift region being performed in a random order;
forming a buried diffusion region so as to be connected to a bottom surface of the body region, and have a plurality of projections extending from the body region in a first direction in which the drift region and the body region are separated from each other such that each tip end of the projections reaches a position under the drift region, by implanting an impurity ion having the first conductivity type with implantation energy higher than that used when the body region is formed, using a mask pattern provided with a plurality of slits arranged in a direction parallel to the surface of the semiconductor substrate and perpendicular to the first direction;
forming a source region and a drain region in the body region and the drift region, respectively by implanting impurity ions having the second conductivity type and having a concentration higher than that of the drift region, in the body region and the drift region; and
forming a gate oxide film so as to be commonly overlapped at least on a part of the body region and a part of the drift region, by oxidizing the surface of the semiconductor substrate and forming a gate electrode on the gate oxide film.

* * * * *